(12) United States Patent
Parchure et al.

(10) Patent No.: US 11,791,655 B2
(45) Date of Patent: Oct. 17, 2023

(54) ELECTRICAL GRID CONTROL SYSTEMS AND METHODS USING DYNAMICALLY MAPPED EFFECTIVE IMPEDANCE

(71) Applicant: Dominion Energy, Inc., Richmond, VA (US)

(72) Inventors: Abhineet H. Parchure, Richmond, VA (US); Stephen J. Tyler, Henrico County, VA (US)

(73) Assignee: Dominion Energy, Inc., Richmond, VA (US)

( * ) Notice: Subject to any disclaimer, the term of this patent is extended or adjusted under 35 U.S.C. 154(b) by 12 days.

(21) Appl. No.: 17/220,608

(22) Filed: Apr. 1, 2021

(65) Prior Publication Data
US 2021/0313832 A1    Oct. 7, 2021

Related U.S. Application Data

(60) Provisional application No. 63/004,249, filed on Apr. 2, 2020.

(51) Int. Cl.
*H02J 13/00* (2006.01)
*G05B 17/02* (2006.01)

(52) U.S. Cl.
CPC ........ *H02J 13/00002* (2020.01); *G05B 17/02* (2013.01)

(58) Field of Classification Search
CPC ............... H02J 13/00002; G05B 17/02; G01R 19/2513; G01R 27/02; Y02B 90/20; Y02E 60/00; Y04S 10/30; Y04S 20/00
See application file for complete search history.

(56) References Cited

U.S. PATENT DOCUMENTS

| | | |
|---|---|---|
| 5,708,590 A | 1/1998 | Slutsker et al. |
| 6,532,439 B2 | 3/2003 | Anderson et al. |
| 6,603,290 B2 | 8/2003 | Hochgraf |
| 6,789,241 B2 | 9/2004 | Anderson et al. |
| 6,850,878 B2 | 2/2005 | Smith et al. |
| 7,346,462 B2 | 3/2008 | Delmerico |
| 7,804,184 B2 | 9/2010 | Yuan et al. |
| 7,979,167 B2 | 7/2011 | Delmerico et al. |

(Continued)

OTHER PUBLICATIONS

Willis, H. Lee, Power Distribution Planning Reference Book, Second Edition, 2004.

(Continued)

*Primary Examiner* — Ziaul Karim
(74) *Attorney, Agent, or Firm* — Blank Rome LLP

(57) ABSTRACT

An electric power control system and methods are described herein in which a determined effective impedance between a first sensor and a second sensor is determined and instructions to an adjusting device based on the determined effective impedance are provided. In one example a controller is configured to determine at least one component of the supplied electric power at the plurality of sensors based on a determined effective impedance. In another example, a controller is configured to determine at least one estimated component of the supplied electric power based on the determined effective impedance. In another example, a controller is configured to compare one or more comparison variables from a first time period to one or more comparison variables of a second time period.

48 Claims, 7 Drawing Sheets

(56) References Cited

U.S. PATENT DOCUMENTS

| | | |
|---|---|---|
| 8,310,214 B2 | 11/2012 | Garces Rivera et al. |
| 8,577,510 B2 | 11/2013 | Powell et al. |
| 8,610,306 B2 | 12/2013 | Kirchner |
| 8,712,752 B2 | 4/2014 | Lau et al. |
| 8,716,888 B2 | 5/2014 | Watanabe et al. |
| 8,787,052 B2 | 7/2014 | O'Brien et al. |
| 8,957,666 B2 | 2/2015 | Dong et al. |
| 9,217,419 B2 | 12/2015 | Kang et al. |
| 9,257,845 B2 | 2/2016 | Alonso Sadaba et al. |
| 9,553,453 B2 | 1/2017 | Tyler et al. |
| 9,563,218 B2 | 2/2017 | Hall et al. |
| 9,582,020 B2 | 2/2017 | Powell et al. |
| 9,593,667 B2 | 3/2017 | Gupta et al. |
| 9,647,454 B2 * | 5/2017 | Afzal ................ H02J 13/00002 |
| 9,671,442 B2 | 6/2017 | Wagoner et al. |
| 9,678,520 B2 | 6/2017 | Peskin et al. |
| 9,698,601 B2 | 7/2017 | Watanabe et al. |
| 9,847,647 B2 | 12/2017 | Premerlani et al. |
| 9,866,030 B2 | 1/2018 | Johnson et al. |
| 9,997,921 B2 | 6/2018 | Premerlani et al. |
| 10,056,846 B2 | 8/2018 | Choi |
| 10,180,696 B2 | 1/2019 | Das et al. |
| 10,211,721 B2 | 2/2019 | Becattini et al. |
| 10,218,175 B2 | 2/2019 | Inam et al. |
| 2007/0285079 A1* | 12/2007 | Nasle ...................... G06F 30/20 |
| | | 324/76.22 |
| 2008/0077336 A1* | 3/2008 | Fernandes ......... H02J 13/00006 |
| | | 702/65 |
| 2009/0281673 A1* | 11/2009 | Taft ........................ G06Q 50/06 |
| | | 700/286 |
| 2009/0289637 A1* | 11/2009 | Radtke ................. G01R 31/088 |
| | | 324/629 |
| 2013/0066480 A1 | 3/2013 | Glavic et al. |
| 2013/0077367 A1 | 3/2013 | Zhu et al. |
| 2013/0094596 A1 | 4/2013 | Borisov et al. |
| 2013/0274946 A1 | 10/2013 | Schelenz et al. |
| 2014/0277813 A1* | 9/2014 | Powell ...................... G05F 1/66 |
| | | 700/297 |
| 2015/0025860 A1 | 1/2015 | Andresen et al. |
| 2015/0300320 A1 | 10/2015 | Diedrichs |
| 2016/0091537 A1 | 3/2016 | Gaarder |
| 2016/0147215 A1 | 5/2016 | Baone et al. |
| 2017/0229863 A1* | 8/2017 | Hall ................. H02J 13/00004 |

OTHER PUBLICATIONS

De Steese et al., "Estimating Methodology for a Large Regional Application of Conservation Voltage Reduction," *IEEE Transactions on PowERSs*, 1990.

Evaluation of Conservation Voltage Reduction (CVR) on a National Level, PNNL-19596, Prepared for the U.S. Department of Energy under Contract DE-AC05-76RL01830, Pacific Northwest National Lab, Jul. 2010.

*Green Circuit Field Demonstrations*, EPRI, Palo Alto, CA, 2009, Report 1016520.

*Green Circuits: Distribution Efficiency Case Studies*. EPRI, Palo Alto, CA: 2011. 1023518.

Kirshner, D., "Implementation of Conservation Voltage Reduction at Commonwealth Edison," *IEEE Transactions on PowERSs*, 1990.

Lauria, D.M., "Conservation Voltage Reduction at Northeast Utilities," *IEEE*, 1987.

Reklaitis et al., Engineering Optimization Methods and Applications, First Edition, John Wiley and Sons, 1983.

Simplified Voltage Optimization (VO) Measurement and Verification Protocol, Simplified VO M&V Protocol Version 1.0, May 4, 2010.

Utility Distribution System Efficiency Initiative (DEI) Phase 1, Final Market Progress Evaluation Report, No. 3, E08-192 (Jul. 2008) E08-192.

Green Circuits: "Distribution Efficiency Case Studies." EPRI, Palo Alto, CA: 2011. 1023518. (382 pages).

Global Energy Partners, LLC. "Utility Distribution System Efficiency Initiative (DEI) Phase 1." Final Market Progress Evaluation Report, No. 3, E08-192 (Jun. 27, 2008) E08-192. (210 pages).

* cited by examiner

ELECTRICAL GRID CONTROL SYSTEMS AND METHODS USING DYNAMICALLY MAPPED EFFECTIVE IMPEDANCE

CROSS REFERENCE TO RELATED APPLICATION

This application claims priority under 35 U.S.C. § 1.119 (e) to U.S. Provisional Patent Application Ser. No. 63/004,249, filed Apr. 2, 2020, which is hereby incorporated by reference in its entirety.

BACKGROUND OF THE INVENTION

Electricity is commonly generated at a power station by electromechanical generators, which are typically driven by heat engines fueled by chemical combustion or nuclear fission or driven by kinetic energy flowing from water or wind. The electricity is generally supplied to end users through transmission grids as an alternating current signal. The transmission grids may include a network of power stations, transmission circuits, substations, and the like.

The generated electricity is typically stepped-up in voltage using, for example, generating step-up transformers, before supplying the electricity to a transmission system. Stepping up the voltage improves transmission efficiency by reducing the electrical current flowing in the transmission system conductors, while keeping the power transmitted nearly equal to the power input. The stepped-up voltage electricity is then transmitted through the transmission system to a distribution system, which distributes the electricity to end users or consumption locations or energy usage devices. The distribution system may include a network that carries electricity from the transmission system and delivering it to end users. Typically, the network may include medium-voltage (for example, less than 69 kV) power lines, electrical substations, transformers, low-voltage (for example, less than 1 kV) distribution wiring, electric meters, and the like.

The following, the entirety of each of which is herein incorporated by reference, describe subject matter related to power generation or distribution: Engineering Optimization Methods and Applications, First Edition, G. V. Reklaitis, A. Ravindran, K. M. Ragsdell, John Wiley and Sons, 1983; Estimating Methodology for a Large Regional Application of Conservation Voltage Reduction, J. G. De Steese, S. B. Merrick, B. W. Kennedy, IEEE Transactions on PowERSs, 1990; Power Distribution Planning Reference Book, Second Edition, H. Lee Willis, 2004; Implementation of Conservation Voltage Reduction at Commonwealth Edison, IEEE Transactions on PowERSs, D. Kirshner, 1990; Conservation Voltage Reduction at Northeast Utilities, D. M. Lauria, IEEE, 1987; Green Circuit Field Demonstrations, EPRI, Palo Alto, Calif., 2009, Report 1016520; Evaluation of Conservation Voltage Reduction (CVR) on a National Level, PNNL-19596, Prepared for the U. S. Department of Energy under Contract DE-AC05-76RL01830, Pacific Northwest National Lab, July 2010; Utility Distribution System Efficiency Initiative (DEI) Phase 1, Final Market Progress Evaluation Report, No 3, E08-192 (July/2008) E08-192; Simplified Voltage Optimization (VO) Measurement and Verification Protocol, Simplified VO M&V Protocol Version 1.0, May 4, 2010; MINITAB Handbook, Updated for Release 14, fifth edition, Barbara Ryan, Brian Joiner, Jonathan Cryer, Brooks/Cole-Thomson, 2005.

Further, U.S. patent application 61/176,398, filed on May 7, 2009 and U.S. Pat. No. 8,577,510 (the '510 patent) entitled VOLTAGE CONSERVATION USING ADVANCED METERING INFRASTRUCTURE AND SUBSTATION CENTRALIZED VOLTAGE CONTROL (the '510 patent), the entirety of each of which is herein incorporated by reference, describe a voltage control and energy conservation system for an electric power transmission and distribution grid configured to supply electric power to a plurality of user locations. U.S. patent application 61/800,396, filed on Mar. 15, 2013, and U.S. Pat. No. 9,582,020 (the '020 patent), filed Feb. 28, 2014, entitled MAXIMIZING OF ENERGY DELIVERY SYSTEM DELIVERY SYSTEM COMPATIBILITY WITH VOLTAGE OPTIMIZATION USING AMI-BASED DATA CONTROL AND ANALYSIS, the entirety of each are herein incorporated by reference, describe a voltage control system for making the voltage optimization system for an electrical delivery system compatible with high variation distributed generation and loads. U.S. patent application 61/789,085, filed on Mar. 15, 2013, and U.S. patent application Ser. No. 14/193,190, filed Feb. 28, 2014, entitled ELECTRIC POWER SYSTEM CONTROL WITH MEASUREMENT OF ENERGY DEMAND AND ENERGY EFFICIENCY USING T-DISTRIBUTIONS, the entirety of each are herein incorporated by reference, describe measuring the effects of optimizing voltage, conserving energy, and reducing demand using t distributions. U.S. patent application 61/800,028, filed on Mar. 15, 2013, and U.S. patent application Ser. No. 14/193,770, filed Feb. 28, 2014, entitled MANAGEMENT OF ENERGY DEMAND AND ENERGY EFFICIENCY SAVINGS FROM VOLTAGE OPTIMIZATION ON ELECTRIC POWER SYSTEMS USING AMI-BASED DATA ANALYSIS, the entirety of each are herein incorporated by reference, describe improved controlling of the voltage on distribution circuits with respect to optimizing voltage, conserving energy, reducing demand and improving reliability. U.S. patent application 61/794,623, filed on Mar. 15, 2013, and U.S. patent application Ser. No. 14/193,872, filed Feb. 28, 2014, entitled ELECTRIC POWER SYSTEM CONTROL WITH PLANNING OF ENERGY DEMAND AND ENERGY EFFICIENCY USING AMI-BASED DATA ANALYSIS, the entirety of each are herein incorporated by reference, describe improved control of an electric power system including planning the distribution circuits with respect to optimizing voltage, conserving energy, and reducing demand.

Many modern electrical transmission and distribution systems (together referred to herein as a "grid") estimate the resistance to power transmission (or impedance) in different portions of the grid in order to predict, based on the known power characteristics at the power generation facility or substation, the condition of the power at the various end users. Such model-based predictions combine impedance data from conductor size, length and spacing with load flow models. However, the model-based process lacks significant insight to local factors that cause voltage decay, resulting in significant errors.

In another aspect of grid control, some systems utilize sensors throughout the grid in order to more efficiently operate or control the grid. For example, the '510 patent describes the use of advanced metering infrastructure (AMI) meters (or other sensors) to sense voltage at the end users to more effectively implement conservation voltage reduction (CVR), and the '020 patent describes utilizing sensor report-by-exception data to recognize patterns associated with grid events, such as highly variable loads. Other examples of utilizing sensors for grid control are referred to in the incorporated by reference material. Such use of sensors can decrease the power loss in the transmission and distribution system, improve grid functionality, and determine errors throughout the system.

However, it is expensive and inefficient to utilize different sensors for each grid control application. Therefore, sensors that can report sensor data to more than one application may be utilized. For example, a sensor that measures one component of electrical power at an end-user (e.g., energy usage by an end-user) may also be adapted to measure another electrical power component, for example, voltage, current, phase angle, phase difference, volts-ampere-reactive (VAR), and/or power factor. Yet, such sensors do not have unlimited processing power or connectivity bandwidth to the respective grid controller. For example, while the sensor is actively measuring or communicating sensor data related to end-user customer energy usage, the sensor, or its respective communication link, may not have sufficient bandwidth to effectively communicate voltage information for timely use by a grid controller, whether it be a manual operator or an automated controller, for example, an automated CVR controller. External disruptions, such as weather-related events, electromagnetic interference, or maintenance may also affect utilized sensor and/or communication links making the sensor not available for grid control decisions. As more grid control systems begin relying on sensor data from sensors, the impact of bandwidth limitations or external disruptions will increase.

DETAILED DESCRIPTION OF THE INVENTION

Figure 1:
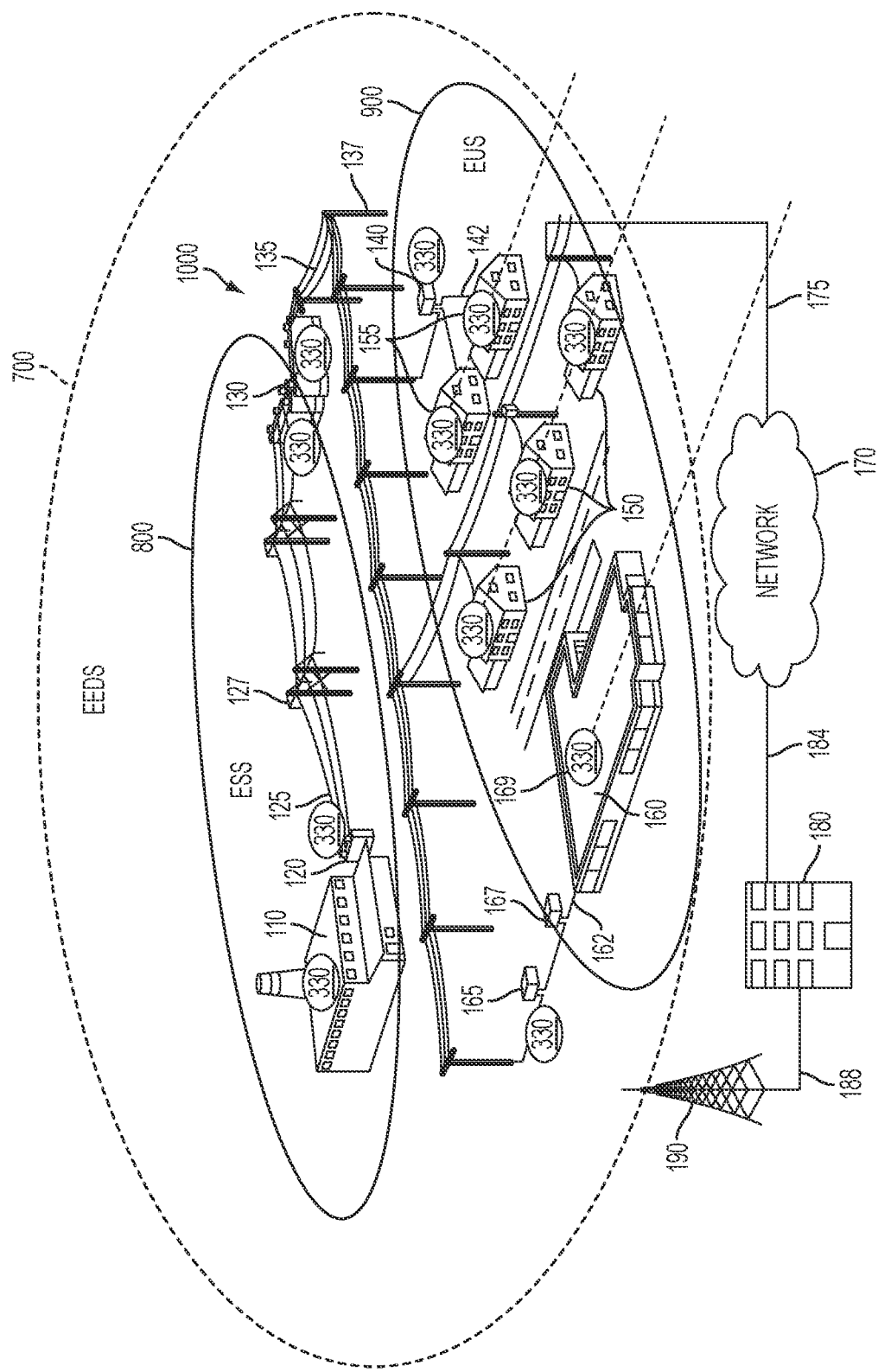
FIG. 1 shows a schematic view of an example electric energy delivery system and associated components in accordance with disclosed embodiments.

Disclosed herein are example grid systems, grid controllers, and methods of controlling the grid that make use of measured and predicted effective system impendences between various locations on the grid, for example, between a supply point and a demand point, e.g., between a power generation facility and a circuit substation or between a circuit substation and one or more end users on the respective circuit. In addition, disclosed systems, controllers, and methods may also map the effective impedances and voltage drop patterns over time in order to accurately predict effective impedances and voltage drop in the future. Such predictions may be beneficial in evaluating outlier readings from sensors, as well as function as a backup when sensors cannot effectively communicate, for example, due to an environmental disruption or to bandwidth limitations or fault of the sensor or communication link.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features. In addition, described methods, processes, steps, or decisions may be carried out by an appropriately programmed processor or embodied into a computer readable media, including but not limited to non-transient memory, disc drive, or other storage medium.

FIG. 1 shows an example of an electric energy delivery system (EEDS) 700, including an energy supply system (ESS) 800, an energy usage system (EUS) 900 and an electrical energy distribution connection system (EEDCS) system 1000, according to principles of the disclosure. The EEDS 700 includes an electrical power generating station 110, a generating step-up transformer 120, transmission media 125, a substation 130, distribution media 135, a plurality of step-down transformers 140, 165, 167, and users 150, 160. The electrical power generating station 110 generates electrical power that is supplied to the step-up transformer 120. The step-up transformer steps-up the voltage of the electrical power and supplies the stepped-up electrical power to an electrical transmission media 125. The ESS 800 includes the station 110, the step-up transformer 120, and the higher voltage side of substation 130, including the electrical transmission media 125 therebetween. The EEDCS system 1000 includes the lower voltage side of substation 130, distribution media 135, the step-down transformers 140, 165, 167, the energy regulation system (ERS) 500 as described below, and the electrical transmission media 125 and distribution media 135 for transmitting the power from the station 110 to users 150, 160, as well as the connections and any other equipment located between the ESS 800 and the EUS 900. The EUS 900 includes an energy delivery system (EDS) 300 as described below, including for example the user sensors or meters, and a number of energy usage devices (EUD) 920 that may be consumers of power, or loads, including customer equipment and the like.

As seen in FIG. 1, the electrical transmission media 125 and distribution media 135 may include wire conductors, which may be carried above ground by, for example, utility poles 127, 137 and/or underground by, for example, shielded conductors (not shown). The electrical power is supplied from the step-up transformer 120 to the substation 130 as electrical power $E_{In}(t)$, where the electrical power $E_{In}$ (FIG. 2) in MegaWatts (MW) may vary as a function of time t. The substation 130, through the use of a transformer, converts the received electrical power $E_{In}(t)$ to $E_{Supply}(t)$ and supplies the converted electrical power $E_{Supply}(t)$ to the plurality of users 150, 160. The substation 130, via a transformer, may adjustably transform the voltage component $V_{In}(t)$ of the received electrical power $E_{In}(t)$ by, for example, stepping-down the voltage before supplying the electrical power $E_{Supply}(t)$ to the users 150, 160. The electrical power $E_{Supply}(t)$ supplied from the substation 130 may be received by the step-down transformers 140, 165, 167 and supplied to the users 150, 160 through a user medium 142, 162, such as, for example, but not limited to, underground electrical conductors (and/or above ground electrical conductors).

The EEDS 700 may include a variety of sensors 330 at various locations throughout the distribution system. For example, each of the users 150, 160 may include a sensor 330, as well as substation 130, which may include both upstream and downstream sensors. The sensors 330 may be coupled to a Regional Operations Center (ROC) 180. The ROC 180 may be coupled to the sensors 330, by means of a plurality of communication links 175, 184, 188, a network 170 and/or a wireless communication system 190. The wireless communication system 190 may include, but is not limited to, for example, an RF transceiver, a satellite transceiver, and/or the like.

The network 170 may include, for example, at least one of the Internet, a local area network (LAN), a wide area network (WAN), a metropolitan area network (MAN), a personal area network (PAN), a campus area network, a corporate area network, a serial data network, the electrical transmission media 125, 135 and transformers 140, 165, 167, a global area network (GAN), a broadband area network (BAN), or the like, any of which may be configured to communicate data via a wireless and/or a wired communication medium. The network 170 may be configured to include a network topology such as, for example, direct, a ring, a mesh, a line, a tree, a star, a bus, a full connection, or the like.

The sensors 330 may include any one or more of the following: a smart meter; an Advanced Meter Infrastructure (AMI); a current transformer (CT); a potential transformer (PT), a network interface (for example, a WAN interface, or the like); a processor; and other associated firmware, software, hardware, and the like. The sensor may be configured to determine any one or more of the following components of electrical power: kilo-Watt-hours (kWh) delivered; kWh received; kWh delivered plus kWh received; kWh delivered minus kWh received; interval data; demand data; power (W); voltage (V); current (I); phase difference ($\varphi$); VAR; power factor (PF), and the like. If the sensor is a multi-phase meter, then the values for each phase may be used independently or combined, where appropriate. The sensors 330 upon determining any one or more of the components of electrical power will generate sensor data reflecting the determined component of electrical power and the time and which it was determined. The sensors 330 may transmit the sensor data immediately or store the sensor data and subsequent sensor data until requested or connection is established by the ROC 180.

The sensors 330 may further interface with one or more collectors 350 (shown in FIG. 2) configured to collect sensor data from one or more sensors 330, and tasked with, for example, measuring and reporting electric power delivery and consumption at one or more locations. For example, a collector may be a remote terminal unit. Alternatively (or additionally), the one or more collectors may be located external to a substation 530, node, or the users 150, 160, such as, for example, in a housing holding the step-down transformers 140, 165, 167 or other location. Each of the collectors may be configured to communicate with the ROC 180. While a collector 350 is not necessary, it may aid in collecting and forwarding sensor data from the sensors 330 to the ROC 180.

Electric Power Grid Control System 200

Figure 2:
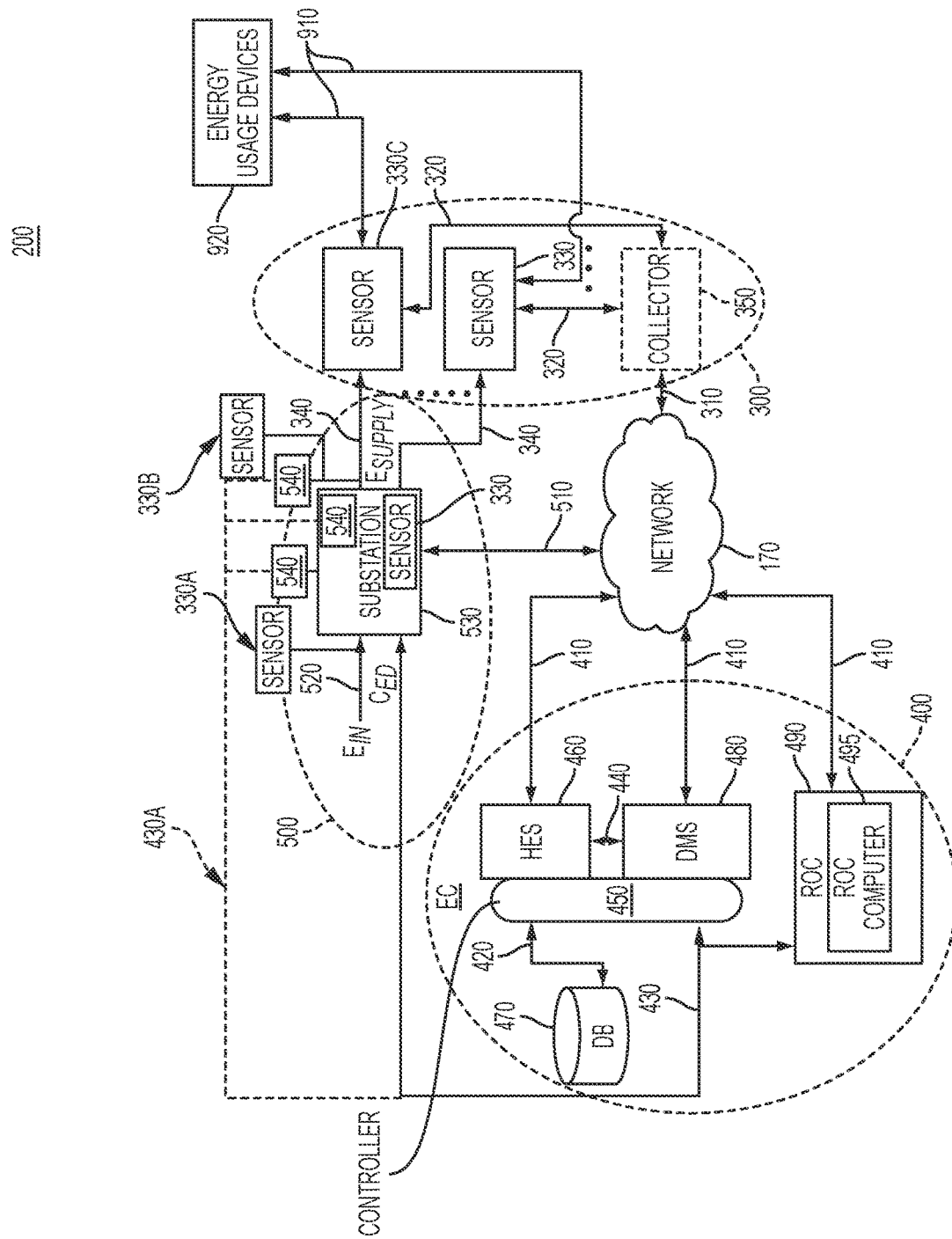
FIG. 2 shows an example schematic view of an example grid control system in accordance with disclosed embodiments.

According to one non-limiting example of the disclosure, a grid control system 200 is provided (shown in FIG. 2). The electric power grid control system 200, also referred to herein as the grid control system 200 or electric power control system 200, may include several subsystems, including an energy delivery system (EDS) 300, an energy control system (ECS) 400, and/or an energy regulation system (ERS) 500. These subsystems may overlap with other systems. The grid control system 200 is configured to monitor one or more components of electrical power at a plurality of distribution locations, for example, at a power generating station 110, a substation 530 within the ERS 500, within the EDS 300, at the users 150, consumption locations, or energy usage devices, or at any other geographic or electrical location within the EEDS 700 and determine one or more energy delivery parameters at the ECS 400 (controller 450). The ECS 400 may then provide the one or more energy delivery parameters $C_{ED}$ to the ERS 500 to adjust a component of supplied electrical power $E_{Supply}$. The ECS 400 may also use information received from other control systems to control the EEDS 700 in other ways. For example, components of the EEDS 700 may be modified, adjusted, added or deleted, including the modification of voltage regulators, changes to end-user equipment to modify customer efficiency, and other control actions. In addition, the ECS 400 using, for example, controller 450 may execute the various determining steps described herein as well as other verbs described passively throughout this disclosure.

The grid control system 200 may be integrated into, for example, an existing electrical power supply control system, including load curtailment plans and voltage conservation systems. In addition, the ECS 400 may be integrated with other control systems, for example a CVR controller or a VAR optimization and control system. For example, portions of the grid control system 200 system may reside as software modules on systems configured to also perform voltage conservation or other power control functions and share components or software modules as practical. The grid control system 200 may be configured to yield to the control of other voltage and/or system level controllers, for example, when one or more predetermined events are triggered.

As discussed above, in one example, the grid control system 200 can include the EDS 300, the ECS 400 and the ERS 500, each of which is shown as a broken-line ellipse.

The grid control system 200 is configured to monitor a component of electrical power at any location within EDS 700, for example within the EDS 300 and/or ERS 500. The grid control system 200 can monitor a component of electrical power at one or more locations, for example, component adjuster 540, any of sensors 330, i.e., sensors 330A, 330B, or 330C, and/or users 150, 160 (shown in FIG. 1) and send energy information to the ECS 400. The ECS 400 processes the at least one component of electrical power information and generates one or more energy delivery parameters $C_{ED}$, which it sends to the ERS 500 via communication link 430. The ERS 500 receives the one or more energy delivery parameters $C_{ED}$ and adjusts the one or more component adjusters 540 based on the energy delivery parameters $C_{ED}$.

The grid control system 200 may include a closed loop process control application that uses data provided by the EDS 300 and/or ERS 500 to control, for example, at least one component adjuster 540 within the ERS 500.

The ECS 400 may send control signals as energy delivery parameters $C_{ED}$, or any other form of control signal, to the Component adjusters 540. For example, control signals (i.e., $C_{ED}$) may be sent to a substation 530 via communications link 430 and include other energy control parameters, for example, voltage set-points. In another example, control signals may be sent via communications link 430 directly to the component adjuster 540 via a wired or wireless connection.

ERS 500

The ERS 500 may communicate with the EDS 300 and/or ECS 400 by means of the network 170. The ERS 500 is coupled to the network 170 and the ECS 400 by means of communication links 510 and 430, respectively. The ECS 500 is also coupled to the EDS 300 by means of the power lines 340, which may include communication links.

The ERS 500 includes a substation 530 which receives the electrical power supply $E_{In}(t)$ from, for example, the power generating station 110 (shown in FIG. 1) on a line 520. The electrical power $E_{In}(t)$ includes a voltage $V_{In}(t)$ component and a current $I_{In}(t)$ component. The substation 530 adjustably transforms, via a transformer, the received electrical power $E_{In}(t)$, for example, to reduce (or step-down) the voltage component $V_{In}(t)$ of the electrical power $E_{In}(t)$ to a voltage value $V_{Supply}(t)$ of the electrical power $E_{Supply}(t)$ supplied to the plurality of sensors 330 on the power supply lines 340.

The substation 530 may include a component adjuster 540 (also referred to herein as a component adjusting device) for adjusting one or more component of the $E_{Supply}(t)$. For example, component adjuster 540 may be a transformer (not shown), such as, for example, a load tap change (LTC) transformer that responds to the energy delivery parameter. In this regard, the substation 530 may further include an automatic tap changer mechanism (not shown), which is configured to automatically change the taps on the LTC transformer. The tap changer mechanism may change the taps on the LTC transformer either on-load (on-load tap changer, or OLTC) or off-load, or both. The tap changer mechanism may be motor driven and computer controlled.

The ERS 500 may also include any number of other component adjusters 540. Component adjuster 540 may be located at substation 530 or in another location separate from substation 530. ERS 500 may include multiple nodes. A node can include the portion of the EEDS 700 under the influence of a Component adjuster 540. For example, if several component adjusters can influence a portion of the EEDS 700, those component adjusters 540 can be grouped into a node. A node can include all of the locations or users downstream of a transformer, for example downstream of a substation 530. Multiple component adjusters 540 can be grouped together in a node such that at least one component of electrical power can be determined for the node. In one example, a node may include only component adjusters downstream of a single transformer. For example, a node may include one transformer and multiple component adjusters 540 downstream of the transformer. A node may also include all locations and sensors 330 downstream of a single transformer. In another aspect, a node may be made up of several sub-nodes, whereby a single transformer has several downstream VAR adjustors 540 that are each controlled individually as nodes.

As noted above, a component adjuster(s) 540 may be any electrical power device configured to adjust a component of the electrical power in the system. For example, a component adjuster 540 may include one more of a load tap change transformer, a regulator, a capacitor, an inductor, variable VAR devices, for example, smart inverters or distribution static var compensators capable of adding or subtracting positive or negative reactive power, a synchronous condenser bank consisting of any number or type of capacitors and/or inductors and/or synchronous condensers configured to add or subtract reactive power. For example, component adjuster 540 may include a load tap change transformer that may adjust the supplied voltage higher or lower depending on the tap location. Component adjuster 540 may also include a load bank of capacitors that when closed (i.e., added) to the ERS 500, it serves to supply reactive power and bring a lagging power factor closer to unity (i.e., 1). Similarly, if the power factor is leading, opening (i.e., subtracting) the load bank of capacitors from the ERS 500 causes the component adjuster 540 to stop supplying reactive power and is configured to bring a leading power factor closer to unity.

In another example, component adjuster 540 may include a load bank of inductors. Because inductors generally consume reactive power instead of supplying it, the effect on power factor and VAR would generally be the opposite of a capacitor bank.

Additionally (or alternatively), the component adjuster(s) 540 may include one or more voltage regulators, or other voltage controlling equipment, as known by those having ordinary skill in the art, that may be controlled to maintain the output of the voltage component $V_{Supply}(t)$ of the electrical power $E_{Supply}(t)$ at a predetermined voltage value or within a predetermined range of voltage values.

The ERS 500 receives the energy delivery parameters $C_{ED}$ from the ECS 400 on the communication link 430, 430A, or any other path, wired or wireless. The energy delivery parameters $C_{ED}$ may include, for example, instructions to adjust, add (close), or subtract (open) component adjusters 540, as well as other instructions, for example, load tap coefficients when an LTC transformer is used to step-down the input voltage component $V_{In}(t)$ of the electrical power $E_{In}(t)$ to the voltage component $V_{Supply}(t)$ of the electrical power $E_{Supply}(t)$ supplied to the EDS 300. The energy delivery parameters $C_{ED}$ can be configured to address the component adjusters 540 individually or in groups.

The at least one electrical power component, for example, voltage (V), current (I), phase angle, phase difference or angle ($\varphi$), VAR, energy usage (MW), or power factor (PF), may be monitored from any of the sensor 330, e.g., at, upstream (high-voltage), or downstream (low-voltage) of substation 530 or the LTC transformer by, for example, sampling or continuously measuring the electrical power component of the stepped-down electrical power $E_{Supply}(t)$ or the electrical power at a particular end-user and storing the measured electrical power component values as a function of time t in a storage, such as, for example, a computer readable medium. The at least one electrical power component may be monitored, for example, at a power generating station 110, a substation distribution bus, at one or more component adjusters 540, any other location, or the like. Further, the electrical power component may be measured at any point where measurements could be made for the transmission or distribution systems in the ERS 500. The electrical power component may be measured by a sensor 330 or other sensors. For example, sensor 330 located at the substation, sensor 330A located upstream of substation 530, or sensor 330B near component adjuster 540B downstream of substation, or sensor 330C at an end-user location, for example, a residential or commercial building.

More than one component of electrical power can be measured at each location, for example, the voltage component $V_{Supply}(t)$ of the stepped-down electrical power $E_{Supply}(t)$ can be measured and monitored as well as the current component $I_{Supply}(t)$ of the stepped-down electrical power $E_{Supply}(t)$. In this regard, a phase difference $\varphi_{Supply}(t)$ between the voltage $V_{Supply}(t)$ and current $I_{Supply}(t)$ components of the electrical power $E_{Supply}(t)$ may be determined and monitored. The ERS 500 can provide the components of electrical power to the ECS 400 individually, for example, $V_{Supply}(t)$ and current $I_{Supply}(t)$, or other components, for example, $\varphi_{Supply}(t)$ or VAR, may be calculated prior to providing the component of electrical power to the ECS 400. The ERS 500 can provide the components of electrical power to the ECS 400 for a single location, i.e., for a node, by measuring directly at a substation 530, or by grouping multiple sensors and various locations within a node to provide a component of electrical power made up from a number of individual locations within the node. It should be noted that sensors that measure many components of electrical power are often complex and expensive and thus those sensors are typically located at substations 530 and upstream locations, whereas sensors that measure power usage and voltage are less complex and expensive to build and thus are more likely to be located at end-user locations where there is need for a greater number of sensors.

The ERS 500 may provide the at least one component of electrical power information to the ECS 400 on the communication links 430 or 510. The ERS 500 can also supply status information for VAR adjustors 540.

The at least one component of electrical power may be provided to the ECS 400 at periodic intervals of time, such as, for example, every second, 5 sec., 10 sec., 30 sec., 60 sec., 120 sec., 600 sec., or any other value within the scope and spirit of the disclosure, as determined by one having ordinary skill in the art. The periodic intervals of time may be set by the ECS 400 or the ERS 500. Alternatively, the at least one component of electrical power may be provided to the ECS 400 or ERS 500 intermittently.

Further, the at least one component of electrical power may be forwarded to the ECS 400 in response to a request by the ECS 400, or when a predetermined event is detected. The predetermined event may include, for example, when a particular component, such as $VAR_{Supply}(t)$, $V_{Supply}(t)$, $I_{Supply}(t)$, $\varphi_{Supply}(t)$, or $PF_{Supply}(t)$ changes by an amount greater (or less) than a defined threshold value over a predetermined interval of time, a temperature of one or more components in the ERS 500 exceeds a defined temperature threshold, or the like.

EDS 300

The EDS 300 includes a plurality of sensors 330. The EDS 300 may further include at least one collector 350, which is optional. The EDS 300 may be coupled to the network 170 by means of a communication link 310. The collector 350 may be coupled to the plurality of sensors 330 by means of a communication link 320. The sensors 330 may be coupled to the ERS 500 by means of one or more power supply lines 340, which may also include communication links.

Each sensor 330 is configured to measure, store and report at least one component of electrical power at associated users 150, 160 (shown in FIG. 1), locations, or nodes throughout ESS 800, EEDCS 1000, or ESU 900. Each sensor 330 is further configured to measure and determine at least one component of electrical power as a function of time. The sensors 330 may measure the at least one component of electrical power at discrete times $t_s$, where s is a sampling period, such as, for example, s=5 sec., 10 sec., 30 sec., 60 sec., 300 sec., 600 sec., or more. For example, the sensors 330 may measure, for example, every minute ($t_{60\ sec}$), five minutes ($t_{300\ sec}$), ten minutes ($t_{600\ sec}$), fifteen minutes ($t_{900\ sec}$), or more, or at time intervals variably set by the sensor 330 (for example, using a random number generator).

The sensors 330 may average the measured component(s) of electrical power values over predetermined time intervals (for example, 5 min., 10 min., 30 min., or more). The sensors 330 may store the measured component(s) of electrical power as sensor data in a local (or remote) storage, such as, for example, a computer readable medium.

Each sensor 330 is also capable of operating in a "report-by-exception" mode for any particular component of electrical power that falls outside of a target band. The target component band may include a target power factor band, a target phase angle difference band, a target voltage band, a target current band, or a target energy usage band. In the "report-by-exception" mode, the sensor 330 may sua sponte initiate communication and send sensor data to the ECS 400. The "report-by-exception" mode may be used to reconfigure the sensors 330 used to represent the system conditions being monitored by the ECS 400.

The sensor data may be periodically provided to the collector 350 by means of the communication links 320. Additionally, the sensors 330 may provide the sensor data in response to a sensor data request signal received from the collector 350 on the communication links 320.

Alternatively (or additionally), the sensor data may be periodically provided directly to the ECS 400 (for example, the head-end server (HES) 460) from the plurality of sensors, by means of, for example, communication links 320, 410 and network 170. In this regard, the collector 350 may be bypassed, or eliminated from the EDS 300. Furthermore, the sensors 330 may provide the sensor data directly to the ECS 400 in response to a sensor data request signal received from the ECS 400. In the absence of the collector 350, the ECS (for example, the HES 460) may carry out the functionality of the collector 350 described herein.

The request signal may include, for example, a query (or read) signal and a sensor identification signal that identifies the particular sensor 330 from which sensor data is sought. The sensor data may include the following information for each sensor 330, including, for example, VAR data, power factor data, kilo-Watt-hours (kWh) delivered data, kWh received data, kWh delivered plus kWh received data, kWh delivered minus kWh received data, voltage level data, current level data, phase angle between voltage and current, kVAR data, time interval data, demand data, and the like.

Additionally, the sensors 330 may send the sensor data to the meter automation system server HES 460. The sensor data may be sent to the HES 460 periodically according to a predetermined schedule or upon request from the HES 460.

The collector 350, if present, may be configured to receive the sensor data from each of the plurality of sensors 330 via the communication links 320. The collector 350 stores the received sensor data in a local storage, such as, for example, a computer readable medium (e.g., a non-transitory computer readable medium). The collector 350 compiles the received sensor data into a collector data. In this regard, the received sensor data may be aggregated into the collector data based on, for example, a node, a geographic zone in which the sensors 330 are located, a particular time band (or range) during which the sensor data was collected, a subset of sensors 330 identified in a collector control signal, and the like. In compiling the received sensor data, the collector 350 may average the voltage component $V_{Meter}(t)$ values received in the sensor data from all (or a subset of all) of the sensors 330.

The ECS 400 is able to select or alter a subset of all of the sensors 330 to be monitored for predetermined time intervals, which may include for example 15 minute intervals. It is noted that the predetermined time intervals may be shorter or longer than 15 minutes. The subset of all of the sensors 330 is selectable and can be altered by the ECS 400 as needed. Utilizing a subset of all of the sensors 330 can be advantageous because it reduces the bandwidth requirements for the network 170 and allows for faster data processing by the ECS 400. For example, the ECS 400 may select a subset of sensors 330 to be monitored on each distribution circuit. In one example, the ECS 400 may select a subset of sensors 330 that are the twenty worst case per node, which may be one or more than one distribution circuit. 5, 10, 15, 25, and 30 sensors may also be selected as the subset on a distribution circuit. One example of a distribution circuit begins at the last downstream (or lowest voltage) piece of equipment in a substation and continue to the end user customer meter location. In one example, the last downstream piece of equipment in a substation is a circuit breaker feeding the distribution circuit from the substation. The worst-case sensors will depend on the component being measured and the particular configuration of the ECS 400. For example, if the ECS 400 is monitoring and/or controlling the grid towards the upper end of a voltage control band, the worst-case sensors 330 will be the sensors having the highest voltages, whereas if the ECS 400 is monitoring and/or controlling the grid towards the lower end of a voltage control band, the worst-case sensors 330 will be the sensors having the lowest voltages. In a typical CVR mode, where voltage is being controlled towards the lower end of the voltage control band, the subset 330 can be selected to include the sensor 330 having the lowest voltages to ensure the end-user voltages do not go below a lower voltage limit. In addition, the ECS 400 may select the subset to include a portion of the sensors 330 having the highest measurements and a portion of the sensors 330 having the lowest measurements. ECS 400 may adjust the sensors 330 within the subset periodically and/or based on received sensor data and or sua sponte report-by exception reports from the sensors 330.

The collector 350 may also average the component of electoral power values received in the sensor data from all (or a subset of all) of the sensors 330. The compiled collector data may be provided by the collector 350 to the ECS 400 by means of the communication link 310 and network 170. For example, the collector 350 may send the compiled collector data to the HES 460 (or ROC 490) in the ECS 400.

The collector 350 is configured to receive collector control signals over the network 170 and communication link 310 from the ECS 400. Based on the received collector control signals, the collector 350 is further configured to select particular ones of the plurality of sensors 330, for example, the subset, and query the sensor data by sending a sensor data request signal to the selected sensors 330. The collector 350 may then collect the sensor data that it receives from the selected sensors 330 in response to the queries. The selectable sensors 330 may include any one or more of the plurality of sensors 330. The collector control signals may include, for example, an identification of the sensors 330 to be queried (or read), time(s) at which the identified sensors 330 are to measure the $V_{Meter}(t)$, $I_{Meter}(t)$, $E_{Meter}(t)$, $\varphi_{Meter}(t)$, $VAR_{Meter}(t)$, $PF_{Meter}(t)$, energy usage information since the last reading from the identified sensor 330, and the like. The collector 350 may then compile and send the compiled collector data to the HES 46W (and/or ROC 490) in the ECS 400.

ECS 400

The ECS 400 may communicate with the EDS 300 and/or ERS 500 by means of the network 170. The ECS 400 is coupled to the network 170 by means of one or more communication links 410. The ECS 400 may also communicate directly with the ERS 500 by means of a communication link 430.

The ECS 400 includes one or more of the HES 460, a database (DB) 470, a distribution management system (DMS) 480, and a regional operation center (ROC) 490. The ROC 490 may include a computer (ROC computer) 495, a server (not shown) and a database (not shown). The HES 460 may be coupled to the DB 470 and DMS 480 by means of communication links 420 and 440, respectively. The DMS 480 may be coupled to the ROC 490 and ERS 500 by means of the communication link 430. The database 470 may be located at the same location as (for example, proximate to, or within) the HES 460, or at a remote location that may be accessible via, for example, the network 170.

The HES 460 may include a computer (not shown) that is configured to receive the collector data from the collector 350, which includes sensor data collected from a selected subset (or all) of the sensors 330. The HES 460 is further configured to retrieve and forward sensor data to the ROC 490 in response to queries received from the ROC 490. The HES 460 may store the collector data, including sensor data in a local storage and/or in the DB 470.

The DMS 480 may include a computer that is configured to receive the component of electrical power status information from the substation 530. The DMS 480 is further configured to retrieve and forward measured electrical power component values in response to queries received from the ROC 490. The DMS 480 also may be further configured to retrieve all "report-by-exception" components of electrical power from the sensors 330 operating in the "report-by-exception" mode and designate a sensor 330 as one of the control points to be continuously read at predetermined times (for example, every 15 minutes, or less (or more), or at varying times). The "report-by-exception components may be used to control the EC 500 set points.

The DB 470 may include one or more of relational databases (not shown). The DB 470 includes a large number of records that include historical data for each sensor 330, each collector 350, each substation 530, and other relevant information related to the respective source of the sensor data, for example, the geographic area(s) (including latitude, longitude, and altitude) where the sensors 330, collectors 350, and substations 530 are located, as well as other information related to grid control as will be discussed further below.

The DB 470 may include any one or more of the following information for each sensor 330, including: a geographic location (including latitude, longitude, and altitude); a sensor identification number; an account number; an account name; a billing address; a telephone number; a sensor type, including model and serial number; a date when the sensor was first placed into use; a time stamp of when the sensor was last read (or queried); the sensor data received at the time of the last reading; a schedule of when the sensor is to be read (or queried), including the types of information that are to be read; and the like.

The historical sensor data may include, for example, any component of electrical power, for example, $V_{Meter}(t)$, $PF_{Meter}(t)$, $I_{Meter}(t)$, $MW_{Meter}(t)$, $VAR_{Meter}(t)$ and/or $\varphi_{Meter}(t)$, as a function of time. Time t may be measured in, for example, discrete intervals at which the component of electrical power is measured or determined at the sensor 330. Given the low cost of memory, the DB 470 may include historical data from the very beginning of when the sensor data was first collected from the sensors 330 through to the most recent sensor data received from the sensors 330.

The DB 470 may include a time value associated with each measured component of electrical power, which may include a timestamp value generated at the sensor 330. The timestamp value may include, for example, a year, a month, a day, an hour, a minute, a second, and a fraction of a second. Alternatively, the timestamp may be a coded value which may be decoded to determine a year, a month, a day, an hour, a minute, a second, and a fraction of a second, using, for example, a look up table. The ROC 490 and/or sensors 330 may be configured to receive, for example, a WWVB atomic clock signal transmitted by the U.S. National Institute of Standards and Technology (NIST), or the like and synchronize its internal clock (not shown) to the WWVB atomic clock signal.

The historical data in the DB 470 may further include historical collector data associated with each collector 350. The historical data may include any one or more of the following information, including, for example: the particular sensors 330 associated with each collector 350; the geographic location (including latitude, longitude, and altitude) of each collector 350; a collector type, including model and serial number; a date when the collector 350 was first placed into use; a time stamp of when data was last received from the collector 350; the data that was received; a schedule of when the collector 350 is expected to send collector data, including the types of information that are to be sent; and the like.

The historical data may be obtained from collector 350 or from sensors 330 directly and may be retrieved from a database or other data storage construct. The historical data may further include, for example, an external temperature value $T_{Collector}(t)$ measured outside of each collector 350 at time t. The historical data may further include, for example, any one or more of the following for each collector 350: an atmospheric pressure value $P_{Collector}(t)$ measured proximate the collector 350 at time t; a humidity value $H_{Collector}(t)$ measured proximate the collector 350 at time t; a wind vector value $W_{Collector}(t)$ measured proximate the collector 350 at time t, including direction and magnitude of the measured wind; a solar irradiant value $L_{Collector}(t)$ (kW/m$^2$) measured proximate the collector 350 at time t; and the like. It should be noted that not all historical data need come from collector 350 or from sensors 330. For example, historical data may also include the amount of solar connected (for example, by maximum generated ever or from maximum registered with the central utility provider, or from maximum power injected), electric vehicle (EV) or other battery charging data (for example, as supplied by the charger itself). Such additional historical data may be communicated through the collector 350 or directly to ECS 400.

The DB 470 may further include sensor, VAR adjustor, and substation data associated with various system components throughout EEDS 700. The data may include any one or more of the following information, including, for example: the identifications of the particular sensors 330 supplied by the substation 530; the identification of component adjusters 540 associated with the particular sensors; the geographic location (including latitude, longitude, and altitude) of the substation 530, sensors 330, and component adjusters 540; the component adjuster 540 type, including model, serial number, number of taps, voltage ratings, capacitive value, inductor value; VAR rating; a history of the adjusting cycles or open and/or shut cycles of any particular component adjuster 540, the number of times a component adjuster has been adjusted in its service lifetime or during a particular time period; the number of distribution circuits; the number of transformers; a transformer type of each transformer, including model, serial number and maximum Megavolt Ampere (MVA) rating; the number of voltage regulators; a voltage regulator type of each voltage regulator, including model and serial number; a time stamp of when substation data was last received from the substation 530; the substation data that was received; a schedule of when the substation 530 is expected to provide electrical energy supply status information, including the types of information that are to be provided; and the like.

The historical substation data may include, for example, at least one component of electrical power supplied to each particular sensor 330 and measured or determined at the input or output of the substation 530.

In the grid control system 200, control may be initiated from, for example, the ROC computer 495. In this regard, a control screen 305 may be displayed on the ROC computer 495, as shown, for example, in FIG. 3 of the US 2013/0030591 publication. The control screen 305 may correspond to data for a particular substation 530 (for example, the TRABUE SUBSTATION) in the ERS 500. The ROC computer 495 can control and override (if necessary), for example, the component adjuster 540 status based on, for example, the sensor data received from the ERS 500 or EDS 300 for the users 150, 160.

For system security, the substation 530 may be controlled through the direct communication link 430 from the ROC 490 and/or DMS 480, including transmission of data through communication link 430 to and from the ER 500, EUS 300 and EVP 600.

Furthermore, an operator can initiate a VAR adjuster control program on the ROC computer 490, overriding the controls, if necessary, and monitoring the time it takes to read the component of electrical power being used for control of, for example, the component adjuster 540 in the ERS 500.

Effective Impedance Determination

Figure 3:
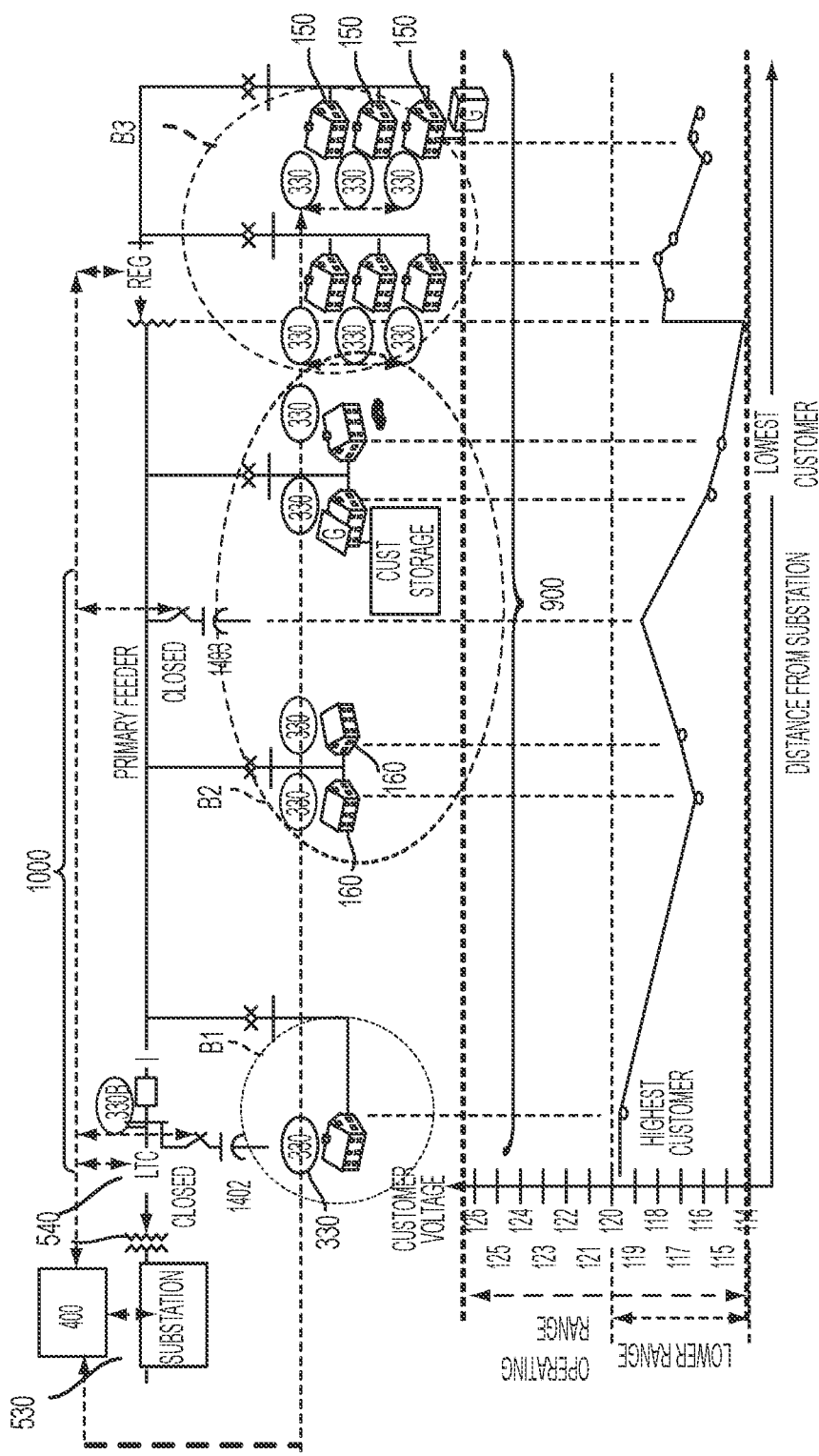
FIG. 3 shows a schematic view of an example node or circuit downstream of a substation or power supply point in accordance with disclosed embodiments.

FIG. 3 shows an example schematic of a node or circuit downstream of a substation 530 including sensors 330 at the substation and end-users 150, 160 and example component adjusters 540 at the substation (e.g., a load tap change (LTC)

transformer indicated schematically) and downstream of the substation 530 (e.g., capacitor banks 1403 and regulator 1402). Also shown schematically as "G" are end-user location having distributed generation, which may include, for example, photovoltaics, wind generators, and energy storage with grid-tie inverters.

The substation 530 will output a particular voltage based on the tap setting of an associated LTC transformer (component adjuster 540 or adjusting device for adjusting a component of the electric power supplied) as determined by ECS 400 and communicated to the substation as an energy delivery parameter $C_{ED}$. Area B1 is electrically closest to the substation 530 and will therefore likely experience higher voltages than area B2, which is electrically further from substation 530. Area B3 is electrically furthest from the substation 530, but is located downstream of voltage regulator 1402, which if activated may result in higher voltage in B3 as compared to B2. Thus, if controlling in the lower range (e.g., 114-120V) of the operating voltage (e.g., 114-126V), the lowest customer would be of most interest if adjusting voltage down to ensure they do not go out of operating range.

Figure 4:
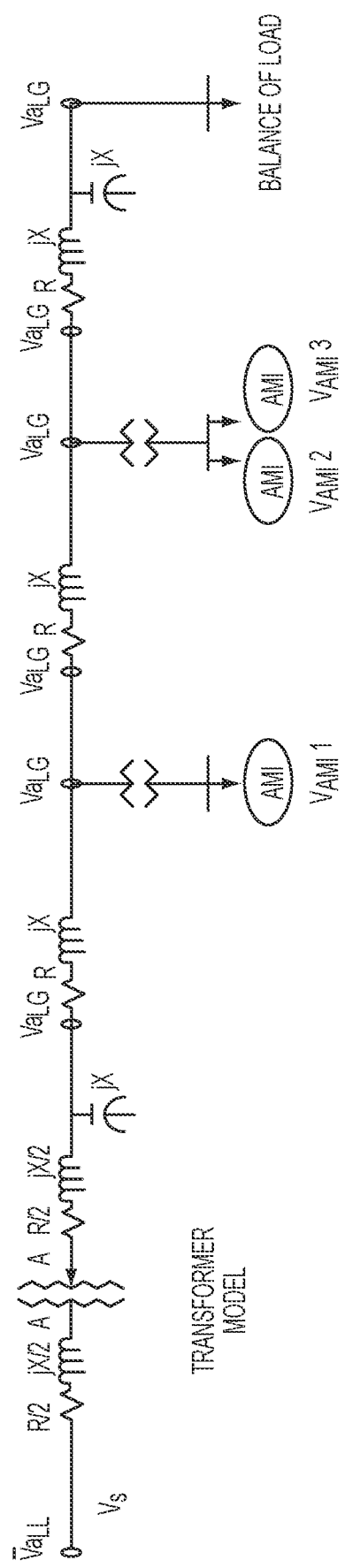
FIG. 4 shows a simplified electrical schematic view of the example node of FIG. 3 in accordance with disclosed embodiments.

FIG. 4 shows a more simplified electrical schematic of the node of FIG. 3, with some items omitted for clarity. The electrical schematic shows an example of how a typical grid controller may estimate a component of electrical power throughout the node by estimating the impedance (as a combination of resistive (R) and inductive (jX) vector components) at different portions of the circuit. The estimated impedance values would be based on the various conductor sizes, lengths, and spacing and then be used in a load flow model to determine, for example, voltages through the system. However, the model-based process lacks significant insight to local factors that cause voltage decay, resulting in significant errors. For example, some local factors that result in model-based process errors include variations in local transformer impedance, secondary conductor impedance, secondary conductor configurations, highly variable local loading, and local infrastructure degradation.

Figure 5:
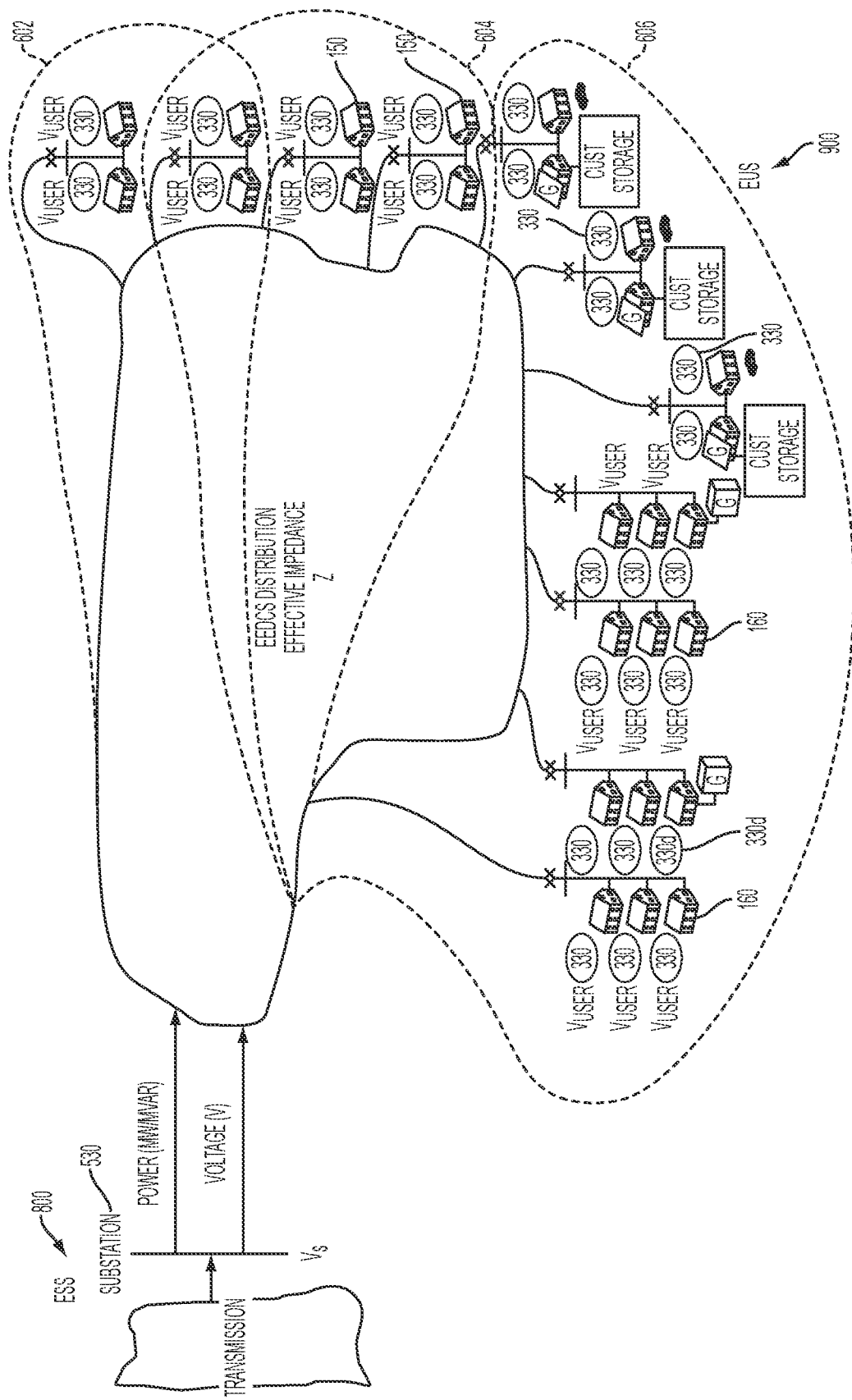
FIG. 5 shows an example schematic view example effective impedances in accordance with disclosed embodiments.

FIG. 5 shows an example schematic view of how components of electrical power can be more effectively estimated by determining the effective impedance Z between a supply point, e.g., the substation 530 or power generating station (FIG. 1) and a respective downstream distribution location, e.g., users 150, 160 (being downstream of the substation 530 and power generating station) or substation 530 (being downstream the power generating station). Instead of estimating the impedance of each portion of the grid based on conductor sizes and lengths, an effective impedance between two locations is determined based on sensor data received from the locations without the need to know the exact path of the load flow, and thus the impedances of the individual conductors. The following example is discussed with respect to determining an effective impedance between substation 530 and one or more users 150,160, e.g., between the substation 530 and the sensor 330 located closest to the user 150 or EUD 920. It should be understood that the effective impedance determination may be made between any two locations of the disclosed grid, for example from a substation to a distribution location, e.g., an end user meter/sensor or from a downline (from the substation) regulator to an end user meter/sensor. In addition, the effective impedance can be determined from a single supply point to a plurality of distribution locations. In another example feature, the effective impendences to a plurality of locations can be averaged into a single pseudo point and an effective impendence is determined from the supply point to the pseudo point representative of the effective impendence to the plurality of locations. The effective impedance can be determined to a plurality of locations by, for example, determining the effective impedance to each of the plurality of locations and averaging, e.g., via mean, median, and or mode, those determined effective impedances.

At the substation, one or more components of electrical power are measured, for example the Megavolt-Amperes (MVA) supplied to the circuit at the substation and the voltage (V) of that supply by an appropriate sensor 330B capable of providing both measurements. In addition, voltage(s) at one or more downstream locations is also measured, for example end users 150, 160 as measured at sensors 330. As discussed above, such downstream locations may be represented by a subset of all of the downstream sensors, for example, the worst-case sensors, which may include the highest or lowest sensor readings depending on the grid control scheme. The rest of this discussion will assume operating under a CVR mode (control scheme) and thus, the grid control scheme may include controlling the voltage toward the lower end of specified operating voltages. Therefore, the worst-case sensors would include the sensors having the lowest voltages. In addition, with the load (MVA) and voltage measurements taken by the sensors, the time of the measurements are also recorded and, optionally, other associated data impedance variable discussed below, e.g., sensor location, humidity, temperature.

For any one downstream sensor, the effective impedance between the supply point (e.g., substation 530) and the user location may be determined, for example by ECS 400 and controller 450, for any given time by taking the difference in voltage between the supply point and the downstream distribution location, squaring that difference and dividing it by the load (MVA) measured at the supply point, which in this example is substation 530, according to EQN. 1:

$$\frac{(V_{Supply} - V_{Dist})^2}{MVA_{Supply}} = \text{Effective Impedance (Z)} \qquad \text{EQN. 1}$$

Where $V_{Supply}-V_{Dist}$ is the change in voltage ($\Delta V_{supply-Dist}$ or voltage drop) from the substation (supply) to the distribution location or user location (or average voltage drop if an average was used), MVA represents the load or power flow in MVA from the substation 530, and Z represents the effective impedance. It should be noted that $V_{Supply}$ and $V_{Dist}$ may be normalized on a per unit basis to either the $V_{Supply}$ or the $V_{Dist}$ if the nominative voltages are different. Alternatively, multiple effective impendences can be determined based on measured supply conditions. For example, EQN 1 utilizes apparent or complex power shown as MVA (megavolts-amperes) for the supply condition, however, reactive or total power shown in megavolts-ampere-reactive (MVAR), real power shown in megawatts (MW), and current (I) may also be utilized to determine alternative effective impendences. For example, each of MVAR and MW may be substituted for $MVA_{Supply}$ into EQN 1 to determine alternative effective impedances. In addition, current I may also be utilized using ohms law, e.g., effective impedance Z equals $\Delta V_{supply-Dist}$ divided by supply current ($I_{Supply}$). Each of the alternative effective impendences are not mutually exclusive. As will be discussed below, more than one alternative effective impedance may be determined for each condition and then verified to determine which alternative provides the most effective predictions for given grid conditions. In one configuration, the effective impedance can be determined between the substation 530 and each and every distribution location (e.g., user location sensor 330) downstream of the substation 530. However, continuously monitoring each and every user location sensor 330 is not necessary if the control system 200 is controlling the grid based on the worst-case sensors 330. In such an example, it is assumed, when operating in a CVR mode (for example), that the controller wants to maintain a lower voltage without the distribution or user location voltages going below a predetermined minimum that may be set, for example, by regulation and account for an adequate margin. For example, for the United States of America, one relevant standard is the American National Standard for Electric Power Systems and Equipment—Voltage Ratings (60 Hertz), ANSI C84.1-2016, published by the American National Standards Institute, Inc., the entirety of which is incorporated by reference herein. Therefore, the effective impendence can be determined by a monitored subset of the sensors (as described above) and, for example, the subset of sensors 330 having the worst-case, e.g., lowest, voltages (in CVR mode). In another example, the controller is operating in a stabilizer mode, see, e.g., U.S. application Ser. No. 15/243,217 filed on Aug. 22, 2016 and titled SYSTEMS AND METHODS FOR STABILIZER CONTROL (the entirety of which is incorporated by reference), and the voltages are being controlled in a higher portion of the operating band, as compared to CVR control, and thus, in such an example, the worst-case sensors 330 may be those having the highest voltages.

As discussed above, the particular sensors 330 that make up the subset of sensors may change based on, for example, historical sensor data, grid control mode, and reports-by-exception. For example, as shown in FIG. 5, at one period of time the worst-case sensor 330 may be those sensors in group 602 and thus, the effective impedance $Z_{602}$ determined at that time will be based on a composition, for example an average, of each of the sensors 330 within group 602. At a different time period, based on sensor data, grid control modes, reports-by-exception, etc., the worst-case sensors 330 may be determined by grid control system 200 to be those of group 604 or group 606. Note, for example, that some sensors 330 may be in more than one sensor group and the groups need not be static. For example, if ECS 400 is utilizing the sensors in group 604 to determine the effective impendence $Z_{604}$ on the circuit and a sensor 330d not in the group 604 is determined by ECS 400, for example by report-by-exception, that the sensor 330d is now one of the worst-case sensors 330, the ECS 400 can add sensor 330d to group 604 or otherwise change the impedance group to include sensor 330d. Optionally, a sensor 330 previously in the control group, e.g., group 604 may also be removed from the group 604. It should also be noted that sensors of a group need not be geographically or electrically located near each other. For example, the worst-case, or lowest voltage, sensors 330 may be those located at the greatest electrical distance from the substation 530 is multiple electrical branches. The determined effective impendence of the subset will also change based on the effective conductor paths between the substation and the current sensors 330 within the subset and where the loads at any particular time are flowing, as well as environmental conditions. For example, as the loads on the circuit shift from one group of distribution locations, or users, to another, the worst-case sensors 330 will likely also shift. Therefore, the control group for determining the effective impedance can be dynamically mapped to those worst-case sensors 330. However, it should be noted that even through the sensors 330 within the subset may change and the effective impendence to that subset may change, the grid control decisions determined by the controller 450 may still be based on the effective impedance between the substation and the selected distribution location sensors (in this example, user location sensors 330) without a full understanding of the load flows in the system so long as the sensors 330 that form the subset are selected based on the extreme conditions the controller 450 is adapted to guard against, whether it be the highest voltages or lowest voltages depending on the grid operating conditions.

In one particular configuration, the voltages of the meters 330 within the subset (also referred to as the control group, e.g., 602, 604, 606) are averaged and the effective impedance is determined by the controller 450 between the substation and average of the sensors 330. In an alternative configuration, only the average of a subset of the subset of sensors 330 is utilized, for example the lowest or highest ten sensors of the subset.

Knowing the effective impedance of a portion of the grid, e.g., each circuit or node, is useful because it can be utilized to predict the status of the grid at various locations should the plurality of sensors 330, or their respective communication links, not be available, e.g., a sensor 330 black out. For example, after the controller 450 recently determined an effective impendence for a particular circuit (e.g., the circuit of FIG. 3,4, or 5) and there is a lack of sensor data from the various end user location settings (e.g., due to the sensors 330 being busy taking readings for billing reasons or due to a weather disturbances), the controller may estimate the voltage drop from substation to the distribution location (or user location) based on information available from the substation alone according to EQN. 2:

$$\Delta V = \sqrt{Z^* MVA_{Supply}}$$ EQN. 2:

Where $\Delta V$ is the estimated voltage drop from the substation to the distribution or user location(s) (or average voltage drop if an average was used), Z represents the effective impedance previously determined by the controller 450, and $MVA_{Supply}$ represents a load or power flow in MVA from the substation 530. In another example, $\Delta V$ can also be determined based on EQN 2 by substituting MW (megawatts) or MVAR (mega-volts-amperes-reactive) measured at the supply point, e.g., substation, or in another example, based on current (I) at the supply point using ohms law, e.g., $\Delta V$ equals current (I) multiplied by effective impedance Z. Therefore, based on updated voltage and power load measurements at the substation an estimated voltage drop can be determined to the distribution locations (or end user locations) using the determined effective impedance. It can be assumed that this estimated voltage drop represents the voltages at the worst-case sensors and the controller can determine whether the voltage, or other component of electrical power at the substation 530, should be adjusted. For example, if the estimated voltage drop indicates, based on the voltage at the substation, that at least one of the worst-case sensors 330 is estimated to be outside (either higher or lower) of a normal operating voltage, then the controller 450 may transmit an energy deliver parameter to the substation 530 that instructs the substation to modify one of its component adjusters 540, e.g., instruct a load tap change transformer to adjust its tap to adjust voltage on the circuit.

The effective impedance is also useful even if there is no disruption in receiving sensor data from sensors 330. For example, the effective impedance and determined estimated voltage drop may be used as a quality check against incoming sensor data. In such a use, the predicted or estimated voltage drop based on the effective impedance can be compared to the measured voltage from the sensor data in order to determine if there is a disagreement. If the predicted and measured voltage drops are not in agreement, it may indicate a malfunction in the circuit or sensor, or a cyber threat that has affected incoming data, or an abnormal circuit condition, which can be reported for investigation and verification.

Effective Impedance Mapped Over Time

The effective impedance varies over time depending on one or more dynamic impedance variables, such as load (MVA) at the substation, time of day, hour of the week, day of the week, type of day (business, weekend, holiday), season, temperature, humidity, cloud cover and/or solar irradiance, amount of distributed generation (solar, wind, battery), volatile loading, for example EV charging, and/or new load patterns (e.g., adding new users or increased or decreased loads). Having predominantly commercial or industrial loads during a busy working time period will likely result in different effective impedances as compared to predominantly residential loads because the flow of power will be across different portions of the grid and have different loading. Similarly, a rise in temperature may cause electrical flows to shift towards residential and commercial air-conditioners and result in different effective impedances. As such, determining the effective impedance at one particular time will allow for effective predictions for those times that have a similar set of dynamic impedance variables/conditions. These conditions are likely to repeat themselves in a cyclic manner, that is, grid conditions between summer workdays having similar temperature, humidity, and cloud cover may result in similar effective impedances. As such, comparing the present conditions to historical effective impedances that were previously determined by the controller 450 results in a more accurate prediction of effective impedances during prolonged sensor data blackouts, i.e., when sensor data is not available. As such, the controller 450 may be configured to record the determined effective impedances in association with one or more of the respective dynamic impedance variables, i.e., the effective impedance is "mapped" with respect to its dynamic impedance variables.

Receiving sensor data and making voltage, or other component of electrical power, adjustments is not practically an instantaneous process. Although, it may become quicker as network and equipment components improve. The controller 450 may be adapted, in one configuration, to calculate voltage drop, load (MVA), and effective impedance on periodic intervals, for example, every 5 minutes, 10 minutes, 15 minutes, 20 minutes, and/or 25 minutes. Although, other intervals may be used provided the interval provides sufficient resolution without overtaxing the control system, component adjusters, and communications infrastructure.

Whether there is a user location sensor data blackout or to verify incoming sensor data, the current dynamic impedance variables may be compared to those previously recorded to determine a match with current conditions. For example, the current dynamic impedance variables may best match those recently determined from a previous periodic measurement (e.g. 15 minutes previously) and thus, it can be assumed the current effective impedance is the same from that time period and a new voltage drop estimate can be determined based on the new MVA and voltage readings from the substation 530. However, after a prolonged user location sensor data blackout, the current dynamic impedance variables may not be a best match for the most recent effective impedance determination. Then, the controller 450 may compare the current dynamic impedance variables with those recorded historically, for example, from another day, month, or year in which the conditions offer the best match. Once a match is located, the controller 450 may utilize the determined effective impedance from that historical match to determine the current predicted voltage drop(s).

Matches may be determined and used when there is a sensor data blackout in order to predict future operational needs (prediction feature) and/or to validate or determine current operating models, e.g., to determine which of the alternative effective impendences methods discussed above is producing the most accurate results (validation feature). The two features or modes are not mutually exclusive.

The following are example features of determining a match between current, or most recent, dynamic impedance variable(s) and those recorded historically. Once it is decided by the ECS 400 or an operator to complete a match, e.g., for validation or sensor blackout, the most recent, i.e., the current, dynamic impedance variables and effective impedance determinations (referred to together herein as comparison variables) over a recent time period are selected for a match. The recent time period may be, for example, the most recent 12 hours, 24 hours, 72 hours, or 168 hours. In addition, the recent data for the comparison variables (referred to herein as recent data) may be selected from the entirety of the data available through the use of smoothing curves, e.g., Fourier transforms and rolling averages, in order to remove any extreme or extraneous data points.

The historical data, i.e., the historical data for the comparison variables, is grouped, according to the described comparison steps, into historical time periods having the same length as the recent time period selected. For example, if the recent time period is a recent 24 hour time period, then the historical data is grouped into historical time periods having a 24 hour length. It should be noted that the historical time periods need not be 24 hours or be mutually exclusive. For example, assuming that the recent 24 hour time period goes from midnight of one day to midnight of the next day, it is likely that the best historical match for the recent time period will also start at midnight based on the cyclic nature of power consumption. Thus, the historical data could be grouped and split into historical time periods where each time period begins at midnight. However, the historical data could also be split into overlapping time periods, so that for example, the first 24 hour time period for evaluation could start at midnight, and the next 24 hour time period could start at 1:00 am, or another time, of the same or different day.

For each time period comparison, the recent data is compared to the historical data, respectively, for each comparison variables based, respectively, on their time offset from the beginning of the respective time periods. For example, if the recent time period was 24 hours long and it started at 12:00 am and the ECS 400 was evaluating a historical time period that started at 1:00 am, then the recent data of 12:05 am would be compared to the historical data of 1:05 am. Likewise, within the same time period comparison, the recent data taken at 12:30 am would be compared to the historical data of 1:30 am. The historical data and recent data may be compared based on the sample interval within the respective data sets. For example, historical and recent data may be available every about 5 minutes, 10 minutes, 15 minutes, 20 minutes, 30 minutes, or 60 minutes, depending on the sampling frequency used at the time of sampling. If either the historical data or recent data was taken at a higher sampling frequency then the historical data within the historical time period, then some data from the higher sampling frequency data set can be ignored where the time offset is in between that of the compared time period or, as an alternative, the data can be combined, e.g., averaged, together for purposes of the comparison.

Within each historical time period, each element of historical data is compared to the respective element of recent data for the respective time offset and comparison variable. Therefore, if a recent 24 hour time period starting at midnight is compared to a historical time period starting at midnight, then the substation load (e.g., in MVA) at 12:00 am, 12:30 am, 12:35 am, and 12:40 am, etc., in the recent time period are respectively compared to the substation load at 12:00 am, 12:30 am, 12:35 am, and 12:40 am, etc. in the historical data set. Likewise, other comparison variables would also be compared for each time offset, e.g., voltage drop, supply current, effective impedance, supply MVA, supply MVAR, type of day (business, weekend, holiday), season, temperature, humidity, cloud cover, amount of distributed generation, determined effective impedance, etc. The exact number of comparisons will depend on the amount of useable data available and for which comparison variable that data is available.

A comparison factor for each comparison variable respectively for each dynamic impedance variable and/or effective impedance determination can be determined by the ECS 40 across each of the time offsets with the comparison. For those comparison variables for which there is a direct numerical equivalent, e.g., solar irradiance, current, voltage drop, etc., the comparison factor can be the simple difference between the respectively compared variables. And, for those comparison variables for which there is no direct numerical equivalent, one can be assigned, e.g., a workday variable can be assigned a Boolean one or for the day being a workday or not and then the difference can be taken of the assigned numerical equivalences. To determine the match or "fit" quality for each respective comparison variable between the historical time period and the recent time period, the comparison factors can be aggregated to represent the total error, respectively, for each comparison variable within the historical time period. The error aggregation can be, for example, a generalized mean, a median absolute deviation (MAD) error calculation, and/or a root-mean-square (RMS) determination. However, other error aggregation methods may also be used, for example, using the area between the curves being compared or the sum of squares of differences between the curves being compared. For the example of a RMS calculation, the comparison factors for a particular comparison variable are squared individually (for each time offset), summed, divided by the number of comparison factors (and therefore the number of comparison), and then the square root is taken. The RMS error determination may then be completed for each comparison variable such that for each historical time period compared to the recent time period, each comparison variable has an RMS error determination. Next, the RMS error determinations may be summed for each historical time period such that each historical time period has a single total RMS error determination. Alternatively, the RMS error determinations for certain comparison variables may be weighted more heavily than others by multiplying each of the comparison variables by a weighting factor prior to summation. For example, impendence and voltage can each have a higher weighting than weather and solar irradiance. Ultimately, the historical time period with the lowest total RMS error determination is the best match for the recent time period.

It should be noted that total loading level can bring additional error into the comparison. Therefore, in one example, both the historical data and recent data are normalized on a per unit basis based on the loading level, by, for example, dividing all of the values in the historical and recent data by their respective loading levels, e.g., at the beginning or end of the respective time periods.

Once a historical time period is determined to be a best match for the recent time period, it can be used for both future control and validation of effective impedance determinations. For the example of future control, it is assumed that the conditions that followed the best matched historical time period will repeat following the recent time period. Thus, for any present operating time (future as compared to recent time period), an operating time offset is determined from the recent time period (e.g., current time minus beginning or end of recent time period). That same operating time offset is added to the historical time period reference (either beginning or end of historical time period so long as the same as the recent time period) to determine which historical data is most relevant to current operating conditions to determine current estimated effective impedances (and therefore other components of electrical power, e.g., voltage drops). Such effective impedances can be used by the ECS 400 to predict whether the electrical conditions at the worst case sensors will be out of bounds for the current control scheme and the ECS 400 can make or recommend appropriate changes. For example, using the estimated effective impedance and the currently sensed or predicted substation current, the ECS 400 may anticipate that the voltage at one or more worst case sensor locations will be out of bounds low based on the trend of expected loading in the historical data and may recommend, or otherwise enact, a voltage increase at the substation to prevent such a condition.

It should be noted that the historical data most relevant to current operating conditions need not be within the best matched historical time period, but would likely be directly thereafter. For example, if operating with a sensor blackout and the most recent 24 hours of useable recent data ended one hour previously, then the best matched historical data would reflect information that was one hour old and the ECS 400 would look to the historical data logged one hour after the end of the best matched historical data. In addition, the best matched historical time period can be updated periodically, for example every 15 minutes, every 30 minutes, every hour, or more, according to the present operating conditions or available sensor information, e.g., the distribution/user sensors may not be available but the substation sensors may be available.

For an example of the validation feature, the predicted operating conditions based on the best matched historical time period can be verified, i.e., compared to current sensor data, to determine which of the alternative effective impendence determinations, e.g., using MVA, MVAR, MW, I, is providing the most reliable predictions of the components of electrical power at the sensor 330. Such information is useful in the event of a need to operate in prediction mode; the alternative effective impedance determination method that was providing the most accurate predictions for the recent time period can be used for the prediction feature. For example, assuming that while validating the recent 24 time period under normal operations, the ECS 400 may determine that the effective impedance calculation based on MVA is providing the most accurate predictions for current grid operating conditions. In such an example, the ECS 400 could locate the best match historical time period using the MVA effective impedance determinations and continue to use the MVA effective impedance for grid predictions going forward as opposed to the other alternative effective impedance determinations. In addition, one particular alternative effective impedance determination may provide more accurate predictions for one circuit or node, while a different alternative effective impedance determination provides more accurate predictions for another circuit or node. As such, ECS 400 can utilize different methods of alternative effective impedance determination for different circuits or nodes.

Figure 6:
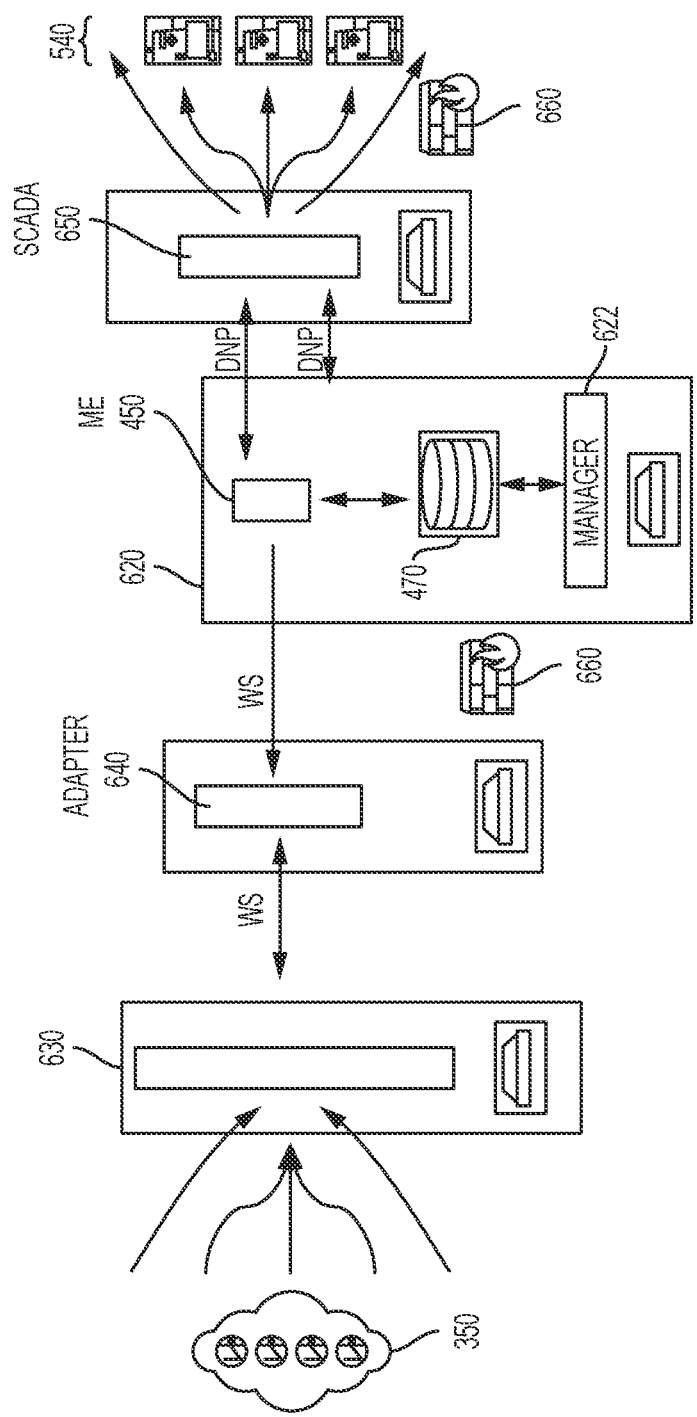
FIG. 6 shows an example schematic view of information technology system architecture in accordance with disclosed embodiments.

FIG. 6 shows one example information technology system architecture, according to principles of the disclosure. While not required, the sensors 330 (FIGS. 1 and 2) can communicate either directly or through collectors 350 to a head end system 630, which if needed provides protocol translation and data buffering. The protocol output of head end system 630 may include, for example, a webservice (WS) protocol, e.g., HTTP or HTTPS, although other protocols can also be used. The head end system 630 can be hosted, for example, by the sensor or AMI provider or by the particular host utility. Adapter 640 may be provided, if needed, to translate the output of head end system 630 for the Manager 620. The Manager 620 can perform the function and provide the structure of ECS 400, including a Manager Engine "ME" configured to perform the function of controller 450. The controller 450 through ECS 400 can be configured to perform substation and system wide grid control through, for example, (DNP3) distributed network protocol 3 to a SCADA adapter 650 for communication to various grid component adjusters 540. The EDGE Manager user interface 622 is for interacting with an operator and can control the Manager Engine "ME" through database 470 manipulation.

Figure 7:
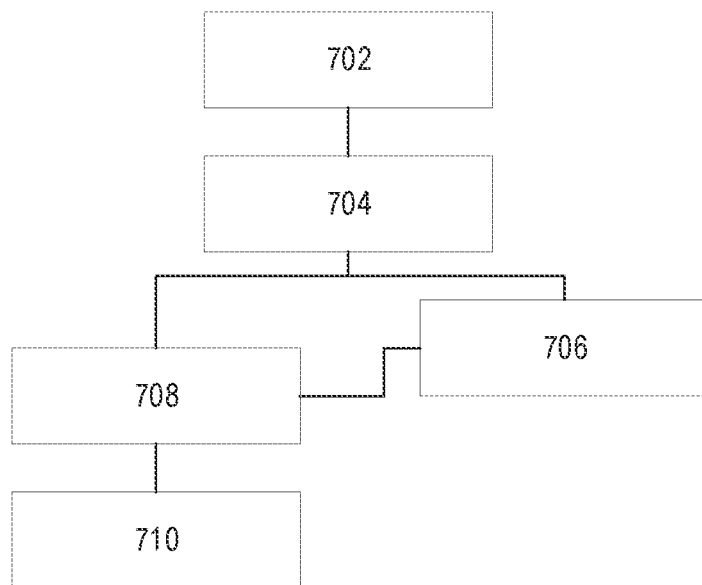
FIG. 7 shows an example method in accordance with disclosed embodiments.

FIG. 7 shows an example method or process 700 of controlling an electric power grid as described in example aspect above. It should be noted that not all steps are required and steps need not be performed in the exact order described unless necessary to do so. Further, additional details of each step may be understood to a person of ordinary skill in view of the description above with respect to FIGS. 1-6. At step 702, measurement data indicative of at least one component of electrical power is received by ECS 400 (FIG. 2) from a subset of the plurality of sensors. Such sensors may include, for example, a sensor at a supply point, e.g. substation 530 (FIG. 2) and one or more other distribution locations, e.g., consumption or consumer locations. As described above, ECS 400 may also measure or record a number of dynamic impedance variables with the measurement data. At step 704, ECS 400 may determine an effective impedance between a first sensors of the subset, e.g., at the supply point, and one or more second sensors, e.g., those sensors at one or more other distribution locations, as discussed above. The determined effective impedance and the dynamic impedance variable form, together, the comparison variables associated with the time period during which they are recorded. At step 706, the determined effective impedance from step 704 may be utilized, together with existing or new measurement data from the supply point to determine or estimate at least one component of the suppled electric power at the subset of the plurality of sensors.

Alternatively, or in addition to, at step 708, the dynamic impedance variables or the comparison variables may be compared to previously recorded comparison variables to determine a time period for which previously recorded comparison variables best match those of the current time period. At step 710, the previously recorded comparison variables may be utilized with current measurement data at the supply point to determine or estimate at least one component of the supplied electrical power at the subset of the plurality of sensors and/or verify measurement data being received from the subset of sensors. More details associated with each of steps 702, 704, 706, 708, and 710 are discussed above with respect to FIGS. 1-6.

Example embodiments of methods, systems, and components thereof have been described herein. As noted elsewhere, these example embodiments have been described for illustrative purposes only and are not limiting. Furthermore, certain processes are described, including the description of several steps. It should be understood that the steps need not be performed in the described order unless explicitly identified as such, and some steps described herein may not be performed at all. The breadth and scope of the present invention should not be limited by any of the above described exemplary embodiments, but should be defined only in accordance with the following claims and their equivalents.

What is claimed as new and desired to be protected by Letters Patent of the United States is:

1. An electric power control system for an electric power grid configured to supply electric power from a supply point to a plurality of consumption locations, the system comprising:

a plurality of sensors, wherein each sensor is located at a respective one of a plurality of distribution locations on the electric power grid at or between the supply point and at least one of the plurality of consumption locations, and wherein each sensor is configured to sense at least one component of the supplied electric power received by the sensor at the respective distribution location and to generate measurement data based on the sensed component; and a controller configured to receive measurement data from each sensor of a subset of the plurality of sensors, wherein the subset includes more than one and fewer than all of the plurality of sensors receiving the supplied electric power, and the controller is further configured to determine a determined effective impedance between a first sensor of the subset at the supply point and a plurality of other sensors of the subset and to provide instructions to an adjusting device based on the determined effective impedance, wherein the determined effective impedance is a combination of the respective determined effective impedances between the first sensor and the plurality of other sensors of the subset, and wherein the controller is configured to add a sensor not in the subset to the subset and to determine a new effective impedance between the supply point and the plurality of other sensors of the subset;

wherein, the adjusting device is configured to adjust a component of the electric power supplied at the supply point based on the instructions.

2. The electric power control system of claim 1, wherein the controller is configured to determine the determined effective impedance by the $$\frac{(V_{Supply} - V_{Dist})^2}{MVA_{Supply}} = \text{Effective Impedance} \quad \text{equation}$$

wherein $V_{Supply} - V_{Dist}$ is the voltage drop from the supply point to the plurality of other sensors, $MVA_{Supply}$ is the load in megavolts amperes (MVA) as apparent or complex power at the supply point.

3. The electric power control system of claim 1, wherein controller is configured to determine the determined effective impedance by the equation:

$$\frac{(V_{Supply} - V_{Dist})^2}{MVAR_{Supply}} = \text{Effective Impedance}$$

wherein $V_{Supply}-V_{Dist}$ is the voltage drop from the supply point to the plurality of other sensors and $MVAR_{Supply}$ is the reactive or total power in megavolts-ampere-reactive (MVAR) at the supply point.

4. The electric power control system of claim 1, wherein the controller is configured to determine the determined effective impedance by the equation:

$$\frac{(V_{Supply} - V_{Dist})^2}{MW_{Supply}} = \text{Effective Impedance}$$

wherein $V_{Supply}-V_{Dist}$ is the voltage drop from the supply point to the plurality of other sensors and $MW_{Supply}$ is the real power in megawatts (MW) at the supply point.

5. The electric power control system of claim 1, wherein the controller is configured to determine the determined effective impedance by the equation:

$$\frac{(V_{Supply} - V_{Dist})}{I_{Supply}} = \text{Effective Impedance}$$

wherein $V_{Supply}-V_{Dist}$ is the voltage drop from the supply point to the other plurality of distribution locations and $I_{Supply}$ is the current in amperes (I) at the supply point.

6. The electric power control system of claim 1, wherein the determined effective impedance is an average of the respective determined effective impedances between the first sensor and the plurality of other sensors of the subset.

7. The electric power control system of claim 1, wherein the controller is configured to remove a sensor in the subset from the subset and to determine a new effective impedance between the supply point and the plurality of other sensors of the subset.

8. The electric power control system of claim 1, wherein the plurality of other sensors of the subset are the sensors sensing the lowest voltages of the plurality of sensors.

9. The electric power control system of claim 1, wherein the plurality of other sensors of the subset are the sensors sensing the highest voltages of the plurality of sensors.

10. The electric power control system of claim 1, wherein the plurality of other sensors of the subset are at other distribution locations.

11. The electric power control system of claim 1, wherein the controller is configured to determine at least one component of the supplied electric power at the plurality of other sensors based on the determined effective impedance.

12. The electric power control system of claim 1, wherein the controller is configured to determine at least one estimated component of the supplied electric power based on the determined effective impedance.

13. The electric power control system of claim 12, wherein the controller is configured to determine an estimated voltage at at least one of the plurality of other sensors of the subset based on the determined effective impedance.

14. The electric power control system of claim 13, wherein the controller being configured to determine an estimated voltage comprises being configured to determine an estimated voltage drop according to the equation:

$$\Delta V = \sqrt{Z \cdot POWER}$$

wherein $\Delta V$ is the estimated voltage drop between the supply point and the at least one of the plurality of sensors, Z is the determined effective impedance, and POWER is the measured power at the supply point, wherein POWER is at least one of a complex power in MVA (mega-volts-amperes) at the supply point, real power in MW (megawatts) at the supply point, and total power in MVAR (mega-volts-amperes-reactive) at the supply point.

15. The electric power control system of claim 13, wherein the controller being configured to determine an estimated voltage comprises being configured to determine an estimated voltage drop according to the equation:

$$\Delta V = I \cdot Z$$

wherein $\Delta V$ is the estimated voltage drop between the supply point and the at least one of the plurality of sensors, Z is the determined effective impedance, and I is a current at the supply point.

16. The electric power control system of claim 1, wherein the controller is configured to compare one or more comparison variables from a first time period to one or more comparison variables of a second time period.

17. The electric power control system of claim 16, wherein the first time period is a more recent time period than the second time period.

18. The electric power control system of claim 16, wherein the controller is configured to compare the same comparison variable from each of the first time period and the second time period.

19. The electric power control system of claim 16, wherein the controller is configured to compare the one or more comparison variables from the first time period to the respective comparison variable from each of a plurality of second time periods.

20. The electric power control system of claim 19, wherein the controller is configured to select one of the plurality of second time periods as being a best match second time period to the first time period.

21. The electric power control system of claim 20, wherein the controller is configured to select the best match second time period by determining an error aggregation between a comparison factor of the one or more comparison variables from the first time period to the respective comparison factor of the one or more comparison variables from each of a plurality of second time periods.

22. The electric power control system of claim 21, wherein the error aggregation includes determining a total error, respectively for each comparison variable.

23. The electric power control system of claim 21, wherein the error aggregation includes determining at least one of a root-mean-square, median absolute deviation, and a generalized mean error aggregation for at least one comparison variable.

24. The electric power control system of claim 16, wherein the controller is further configured to provide instructions to the adjusting device based on the comparison of the one or more comparison variables from a first time period to the one or more comparison variables of a second time period.

25. A method of controlling an electric power grid configured to supply electric power from a supply point to a plurality of consumption locations, the method comprising:

receiving measurement data from each sensor of a subset of a plurality of sensors, wherein each sensor is located at a respective one of a plurality of distribution locations on the electric power grid at or between the supply point and at least one of the plurality of consumption locations, and wherein each sensor is configured to sense at least one component of the supplied electric power received by the sensor at the respective distribution location and to generate measurement data based on the sensed component, wherein the subset includes more than one and fewer than all of the plurality of sensors receiving the supplied electric power;

determining a determined effective impedance between a first sensor of the subset at the supply point and a plurality of other sensors of the subset, wherein the determined effective impedance is an average of the respective determined effective impedances between the first sensor and the plurality of other sensors of the subset;

providing instructions to an adjusting device based on the determined effective impedance;

adjusting, with the adjusting device, a component of the electric power supplied at the supply point based on the instructions; and adding a sensor not in the subset to the subset and determining a new effective impedance between the supply point and the plurality of other sensors of the subset.

26. The method of claim 25, wherein the determined effective impedance is determined by the equation:

$$\frac{(V_{Supply} - V_{Dist})^2}{MVA_{Supply}} = \text{Effective Impedance}$$

wherein $V_{Supply} - V_{Dist}$ is the voltage drop from the supply point to the plurality of other sensors, $MVA_{Supply}$ is the load in megavolts amperes (MVA) as apparent or complex power at the supply point.

27. The method of claim 25, wherein the determined effective impedance is determined by the equation:

$$\frac{(V_{Supply} - V_{Dist})^2}{MVAR_{Supply}} = \text{Effective Impedance}$$

wherein $V_{Supply} - V_{Dist}$ is the voltage drop from the supply point to the plurality of other sensors and $MVAR_{Supply}$ is the reactive or total power in megavolts-ampere-reactive (MVAR) at the supply point.

28. The method of claim 25, wherein the determined effective impedance is determined by the equation:

$$\frac{(V_{Supply} - V_{Dist})^2}{MW_{Supply}} = \text{Effective Impedance}$$

wherein $V_{Supply} - V_{Dist}$ is the voltage drop from the supply point to the plurality of other sensors and $MW_{Supply}$ is the real power in megawatts (MW) at the supply point.

29. The method of claim 25, wherein the determined effective impedance is determined by the equation:

$$\frac{(V_{Supply} - V_{Dist})}{I_{Supply}} = \text{Effective Impedance}$$

wherein $V_{Supply} - V_{Dist}$ is the voltage drop from the supply point to the other plurality of distribution locations and $I_{Supply}$ is the current in amperes (I) at the supply point.

30. The method of claim 25, wherein the determined effective impedance is an average of the respective determined effective impedances between the first sensor and the plurality of other sensors of the subset.

31. The method of claim 25, further comprising removing a sensor in the subset from the subset and determining a new effective impedance between the supply point and the plurality of other sensors of the subset.

32. The method of claim 25, wherein the plurality of other sensors of the subset are the sensors sensing the lowest voltages out of the plurality of sensors.

33. The method of claim 25, wherein the plurality of other sensors of the subset are the sensors sensing the highest voltages out of the plurality of sensors.

34. The method of claim 25, wherein the plurality of other sensors of the subset are at other distribution locations.

35. The method of claim 25, further comprising determining at least one component of the supplied electric power at the plurality of other sensors based on the determined effective impedance.

36. The method of claim 25, further comprising determining at least one estimated component of the supplied electric power based on the determined effective impedance.

37. The method of claim 36, further comprising determining an estimated voltage at at least one of the plurality of other sensors of the subset based on the determined effective impedance.

38. The method of claim 37, wherein determining an estimated voltage comprises determining an estimated voltage drop according to the equation:

$$\Delta V = \sqrt{Z \ast \text{POWER}}$$

wherein $\Delta V$ is the estimated voltage drop between the supply point and the at least one of the plurality of sensors, Z is the determined effective impedance, and POWER is the measured power at the supply point, wherein POWER is at least one of a complex power in MVA (mega-volts-amperes) at the supply point, real power in MW (megawatts) at the supply point, and total power in MVAR (mega-volts-amperes-reactive) at the supply point.

39. The method of claim 37, wherein determining an estimated voltage comprises determining an estimated voltage drop according to the equation:

$$\Delta V = I \ast Z$$

wherein $\Delta V$ is the estimated voltage drop between the supply point and the at least one of the plurality of sensors, Z is the determined effective impedance, and I is a current at the supply point.

40. The method of claim 25, further comprising comparing one or more comparison variables from a first time period to one or more comparison variables of a second time period.

41. The method of claim 40, wherein the first time period is a more recent time period than the second time period.

42. The method of claim 40, further comprising comparing the same comparison variable from each of the first time period and the second time period.

43. The method of claim 40, further comprising comparing the one or more comparison variables from the first time period to the respective comparison variable from each of a plurality of second time periods.

44. The method of claim 43, further comprising selecting one of the plurality of second time periods as being a best match second time period to the first time period.

45. The method of claim 44, wherein selecting one of the plurality of second time periods as being a best match second time period comprises selecting determining an error aggregation between a comparison factor of the one or more comparison variables from the first time period to the respective comparison factor of the one or more comparison variables from each of a plurality of second time periods.

46. The method of claim 45, wherein the error aggregation includes determining a total error, respectively for each comparison variable.

47. The method of claim 45, wherein the error aggregation includes determining at least one of a root-mean-square, median absolute deviation, and a generalize mean error aggregation for at least one comparison variable.

48. The methods of claim 40, further comprising providing instructions to the adjusting device based on the comparison of the one or more comparison variables from a first time period to the one or more comparison variables of a second time period.

* * * * *